United States Patent
Yamazaki et al.

(10) Patent No.: US 8,809,841 B2
(45) Date of Patent: Aug. 19, 2014

(54) LIGHT-EMITTING ELEMENT, LIGHT-EMITTING DEVICE, LIGHTING DEVICE, AND ELECTRONIC DEVICES

(75) Inventors: Shunpei Yamazaki, Tokyo (JP); Kunihiko Suzuki, Kanagawa (JP); Harue Osaka, Kanagawa (JP); Masahiro Takahashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 299 days.

(21) Appl. No.: 13/303,637

(22) Filed: Nov. 23, 2011

(65) Prior Publication Data
US 2012/0126212 A1    May 24, 2012

(30) Foreign Application Priority Data
Nov. 24, 2010   (JP) ................. 2010-261192

(51) Int. Cl.
*H01L 51/50*    (2006.01)
(52) U.S. Cl.
USPC ............. 257/40; 257/E51.001; 257/E51.002; 257/E51.012; 257/E51.018; 257/E51.023; 257/E51.024; 257/E51.026; 257/E51.051; 257/E27.117; 257/E27.119
(58) Field of Classification Search
None
See application file for complete search history.

(56) References Cited

U.S. PATENT DOCUMENTS

| | | | |
|---|---|---|---|
| 5,943,154 A | 8/1999 | Nakayama | |
| 7,307,604 B2 | 12/2007 | Miyagawa et al. | |
| 7,485,375 B2 | 2/2009 | Tokuda et al. | |
| 7,510,905 B2 | 3/2009 | Fujii et al. | |
| 7,655,499 B2 | 2/2010 | Fujii et al. | |
| 7,687,326 B2 | 3/2010 | Morisue et al. | |
| 7,768,617 B2 | 8/2010 | Yamazaki et al. | |
| 7,915,058 B2 | 3/2011 | Aoki et al. | |
| 2003/0143427 A1* | 7/2003 | Matsuo et al. | 428/690 |
| 2005/0282036 A1* | 12/2005 | D'Andrade et al. | 428/690 |
| 2007/0228382 A1* | 10/2007 | Yamazaki et al. | 257/72 |
| 2010/0289026 A1 | 11/2010 | Yamazaki et al. | |
| 2011/0303932 A1* | 12/2011 | Popp et al. | 257/94 |

FOREIGN PATENT DOCUMENTS

JP        2004-342383       12/2004
WO  PCT/DE2009/001450   * 5/2010

* cited by examiner

*Primary Examiner* — Fei Fei Yeung Lopez
(74) *Attorney, Agent, or Firm* — Husch Blackwell LLP

(57) ABSTRACT

A light-emitting element which at least includes a monomolecular layer including a luminescent center material with a fluorescent light-emitting property, and a monomolecular layer including a host material with a carrier (electron or hole)-transport property and a band gap larger than a band gap (note that a band gap refers to the energy difference between a HOMO level and a LUMO level) of the luminescent center material, between a pair of electrodes, in which the monomolecular layer including the host material and the monomolecular layer including the luminescent center material share the same interface, is provided.

20 Claims, 21 Drawing Sheets highest occupied molecular orbital (HOMO)

lowest unoccupied molecular orbital (LUMO)

highest occupied molecular orbital (HOMO)

lowest unoccupied molecular orbital (LUMO)

LIGHT-EMITTING ELEMENT, LIGHT-EMITTING DEVICE, LIGHTING DEVICE, AND ELECTRONIC DEVICES

BACKGROUND OF THE INVENTION

1. Field of the Invention

The present invention relates to a light-emitting element, a light-emitting device, a lighting device, and an electronic device, each of which utilizes electroluminescence of an organic material.

2. Description of the Related Art

An organic compound can take a wider variety of structures than an inorganic compound, and have a possibility to synthesize a material having various functions by appropriate molecular-design of an organic compound. Owing to those advantages, electronics utilizing a functional organic material has been attracting attention in recent years.

For example, a solar cell, a light-emitting element, an organic transistor, and the like are exemplified as electronic devices utilizing an organic compound as a functional material. These are devices taking advantage of electric properties and optical properties of the organic compound. Among them, in particular, a light-emitting element has been making remarkable development.

The light emission mechanism of a light-emitting element is as follows: electrons injected from a cathode and holes injected from an anode recombine in the luminescent center of a light-emitting layer to form molecular excitons by applying a voltage between a pair of electrodes with the light-emitting layer interposed therebetween; and when the molecular excitons relax to a ground state, energy is released to emit light.

Here, it is said that the internal quantum efficiency of a light-emitting element depends on the recombination efficiency, the exciton generation efficiency, the quantum efficiency, and the like of carriers.

Among them, in the exciton generation efficiency, quantum physical chemistry shows that the ratio of a triplet exciton and a singlet exciton, which are generated, is statistically 3:1. For this reason, the maximum internal quantum efficiencies of a light-emitting element using a fluorescent light-emitting material and a light-emitting element using phosphorescent light-emitting material can be 0.25 and 1, respectively.

The recombination efficiency shows the probability of recombination of carriers which are injected from one electrode and do not pass through the other electrode. In order to improve the recombination efficiency, a block layer for trapping carriers is provided with respect to holes or electrons in some cases.

The internal quantum efficiency is defined by the rate of generated photons with respect to the number of electrons injected to a light-emitting element. An improvement of the internal quantum efficiency improves luminous efficiency and reduces power consumption; therefore, many researches have been made in aspects of a material and an element structure (for example, see Patent Document 1).

[Reference]

[Patent Document 1] Japanese Published Patent Application No. 2004-342383

SUMMARY OF THE INVENTION

Deactivation of excitation energy is given as a cause of a decrease in the internal quantum efficiency. When energy of carriers recombined in a host cannot be effectively conveyed to a guest and the energy is deactivated, a large amount of energy is lost, resulting in a decrease in the internal quantum efficiency.

In view of the above, an object of the present invention is to provide a light-emitting element with high luminous efficiency, in which energy transfer from a host to a guest is well.

In addition, the penetration of carriers is also a significant cause of a decrease in the internal quantum efficiency. The "penetration of carriers" means that carriers pass through a light-emitting layer without recombining. Carriers that have passed through a light-emitting layer without recombining do not contribute to light emission, so that the carriers flow as a wasted current. However, when a carrier block layer is used in order to prevent the wasted current, an inconvenience such as an increase in a driving voltage occurs.

In view of the above, an object of the present invention is to provide a light-emitting element with favorable luminous efficiency, in which the penetration of carriers is effectively prevented, or a light-emitting element with favorable luminous efficiency, in which carrier transfer from a host to a guest is well.

Further, an object of the present invention is to provide a light-emitting device or a lighting device with low power consumption.

Furthermore, an object of the present invention is to provide an electronic device with low power consumption.

Note that one embodiment of the present invention may achieve at least one of the above-described objects.

In view of the above objects, the present inventors have found that in a general host-guest type light-emitting layer, a guest is dispersed in a host; thus, loss of energy transfer occurs.

One embodiment of the present invention is a light-emitting element which at least includes a monomolecular layer including a luminescent center material with a fluorescent light-emitting property, and a monomolecular layer including a host material with a carrier (electron or hole)-transport property and a band gap larger than a band gap of the luminescent center material, between a pair of electrodes (Note that a band gap refers to the energy difference between a HOMO level and a LUMO level), and in which one surface of the monomolecular layer including the host material is in contact with one surface of the monomolecular layer including the luminescent center material.

Further, one embodiment of the present invention is a light-emitting element which at least includes a monomolecular layer including a luminescent center material with a phosphorescent light-emitting property, and a monomolecular layer including a host material with a carrier-transport property and a triplet excited energy larger than a triplet excited energy of the luminescent center material, between a pair of electrodes, and in which one surface of the monomolecular layer including the host material is in contact with one surface of the monomolecular layer including the luminescent center material.

The present inventors have found that the internal quantum efficiency is improved with a structure in which excitation energy recombined in a host is more effectively transferred to a guest.

That is, one embodiment of the present invention is a light-emitting element with the above structure, in which a skeleton that contributes to donation of excitation energy in the host material is adjacent to a skeleton that contributes to acceptance of excitation energy in the luminescent center material.

A structure with which a carrier is easily injected to a monomolecular layer of the host material and a monomolecular layer of the guest material is also effective.

That is, one embodiment of the present invention is a light-emitting element with the above structure, in which a layer including a composite material is further included between the pair of electrodes. In the composite material, an acceptor substance is mixed in a substance with a high hole-transport property. A monomolecular layer of the host material is in contact with the layer including the composite material at an interface different from an interface shared by the monomolecular layer of the host material and a monomolecular layer of the luminescent center material.

When a plurality of monomolecular layers of the host material and a plurality of monomolecular layers of the guest material are formed, the leakage of carriers can be reduced. Further, by further providing a layer including the composite material, an increase in a driving voltage due to stacking of the layers can be suppressed.

That is, one embodiment of the present invention is a light-emitting element with the above structure, in which a plurality of stacks is included, each of the stacks including the layer including the composite material, the monomolecular layer of the luminescent center material, and the monomolecular layer of the host material.

The light-emitting elements such that described in the above have high luminous efficiency; therefore, a light-emitting device or a lighting device including a light-emitting element with the above structure has low power consumption.

Thus, one embodiment of the present invention is a light-emitting device or a lighting device including the above light-emitting element and a control circuit controlling light emission of the light-emitting element.

Note that the light-emitting device in this specification includes image display devices, light-emitting devices, or light sources (including lighting device). Further, the light-emitting device includes all of the following modules: modules in which a connector such as an FPC (Flexible Printed Circuit), a TAB (Tape Automated Bonding) tape, or a TCP (Tape Carrier Package) is attached to a panel in which a light-emitting element is formed; modules having a TAB tape or a TCP provided with a printed wiring board at the end thereof; and modules having an IC (Integrated Circuit) directly mounted on a light-emitting device by a COG (Chip On Glass) method.

An electronic device using the light-emitting element of the present invention in its display portion is also included in the category of the present invention. Therefore, an electronic device of the present invention includes a display portion or a lighting portion including the above light-emitting element and the above control circuit controlling light emission of the light-emitting element.

The light-emitting element of the present invention has high luminous efficiency.

The light-emitting device or the lighting device of the present invention has low power consumption.

The electronic device of the present invention has low power consumption.

DETAILED DESCRIPTION OF THE INVENTION

Figure 1A:
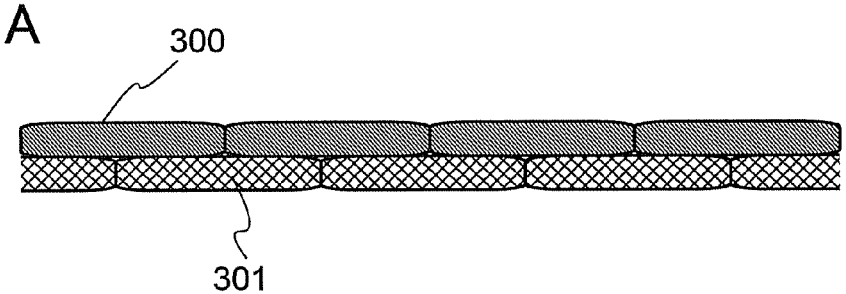
FIGS. 1A to 1C are conceptual views of the present invention.

Embodiments of the present invention will now be described with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiments.
(Embodiment 1)

The present inventors have considered that transfer of excitation energy in a host by carriers recombined in the host to a guest affects the internal quantum efficiency of a current-excitation type light-emitting element using an organic compound as a luminescent center substance. In a light-emitting element including a host-guest type light-emitting layer, a guest that is a luminescent center substance is dispersed in a host material that is to be a body. Therefore, part of energy of carriers recombined in the host has been deactivated before it has been transferred to the guest, resulting in a decrease in the internal quantum efficiency.

Further, the present inventors have considered that in the case where a guest is dispersed in a host material, part of carriers injected to the host material are not recombined in the guest and penetrate to an adjacent layer.

Here, in a light-emitting element described in this embodiment, guest molecules that are luminescent center materials exist in contact with all the host molecules in a light-emitting layer. In the light-emitting element having such a structure, carriers injected to the host molecule or excitation energy generated in the host molecule can be effectively transferred to the luminescent center material.

That is, when a monomolecular layer of a host material and a monomolecular layer of a luminescent center material are overlapped with each other, in other words, one surface of the monomolecular layer of the host material and one surface of the monomolecular layer of the luminescent center material are in contact with each other, excitation energy of the host can be effectively transferred to the luminescent center material as described above, whereby the internal quantum efficiency can be improved and a light-emitting element with high luminous efficiency can be obtained.

In that case, in order to smoothly give and receive excitation energy, it is preferable that a skeleton having a function of giving excitation energy of the host material (luminophore) and a skeleton having a function of receiving excitation energy of the luminescent center material (chromophore) be adjacent to each other.

Further, in order to smoothly give and receive excitation energy, it is preferable that a skeleton having a function of giving carriers in the host material and a skeleton having a function of receiving carriers in the luminescent center material be adjacent to each other.

As a combination of a host material and a luminescent center material, which can have such an arrangement, a combination of materials in which part of a skeleton of a host material and part of a skeleton of a luminescent center material are similar or the same is given. For example, when a host material and a luminescent center material, each having a skeleton formed of a planar condensed ring are formed, the condensed ring portions are easily formed to be adjacent to each other. Then, carriers or excitation energy can be effectively given and received through the condensed ring portions. Similarly, in the case of a host material and a luminescent center material, each having a heterocyclic ring skeleton, the heterocyclic ring skeleton portions of the host material and the luminescent center material are easily formed to be adjacent to each other. Thus, carriers or excitation energy can be effectively given and received through the heterocyclic ring skeleton portions. Further, a host material having two nitrogen atoms such as a quinoxaline skeleton is similar to an iridium complex having a molecular including two nitrogen atoms as a ligand in that a heterocyclic ring skeleton having two nitrogen atoms is included. Portions of the host material and the iridium complex, which are similar to each other, are easily formed to be adjacent to each other; therefore, carriers or excitation energy can be effectively given and received from the host material to the luminescent center material through the portions.

As another method for effectively giving and receiving excitation energy from a host material to a luminescent center material, there is a method in which the direction of a transition dipole moment of light emission of the host material and the direction of a transition dipole moment of electronic transition of the luminescent center material are arranged to be the same direction as much as possible. A "transition dipole moment" is a difference in polarization of charges when transition between two states occurs. Note that these transition dipole moments can be obtained by the time-dependent density functional theory.

A light-emitting element having the above-described structure is described with reference to the drawings.

FIG. 1A is a conceptual view showing a stacked layer in which one surface of a monomolecular layer of a host material 300 is in contact with one surface of a monomolecular layer of a luminescent center material 301. The light-emitting element described in this embodiment is a light-emitting element including such a stack in a light-emitting layer. Since the host material and the luminescent center material are in contact with each other and the luminescent center material exists in a film form, not in a dispersed form, carriers recombined in the host material or excitation energy can be effectively transferred to the luminescent center material; consequently, the internal quantum efficiency is improved.

Such a monomolecular layer can be formed by relatively transferring a surface where the monomolecular layer is to be manufactured with respect to an evaporation source of the host material or the luminescent center material at appropriate speed. In order to manufacture a stacked structure, one monomolecular layer may be formed by the above method and then the other monomolecular layer may be formed in a similar manner using a different material. Further, an existing method such as a method using a self-assembled monomolecular layer (a SAM film), a Langmuir-Blodgett film (a LB film), or the like may be used.

Further, it is preferable that the monomolecular layer of the host material and the monomolecular layer of the luminescent center material be alternately stacked to form a stack. At this time, a monomolecular layer of the host material and a monomolecular layer of the luminescent center material, which are adjacent to each other, share the same interface. In the case of forming a stack, when focused on an n-th monomolecular layer of the luminescent center material existed in the stack, one interface is shared with an n-th monomolecular layer of the host material and the other interface is shared with an (n+1)-th monomolecular layer of the host material. Similarly, when focused on the (n+1)-th monomolecular layer of the host material, one interface is shared with the n-th monomolecular layer of the luminescent center material and the other interface is shared with the (n+1)-th monomolecular layer of the luminescent center material.

The total thickness of the stack is preferably greater than or equal to 30 nm and less than or equal to 200 nm. This is because carrier balance is easily achieved when the total thickness is greater than or equal to 30 nm and a driving voltage suitable for a light-emitting element is easily kept when the total thickness is less than or equal to 200 nm.

Further, it is more preferable for the monomolecular layer to have a superlattice structure.

Figure 1B:
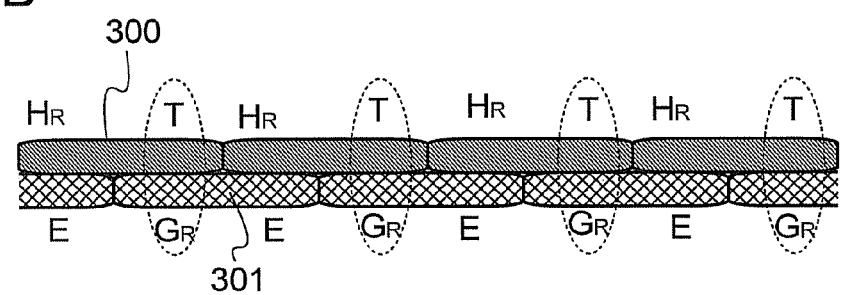

In the host material 300 in FIG. 1B, a portion denoted by T shows a skeleton contributed to donation of carriers or excitation energy in the host material. A portion denoted by $H_R$ shows a skeleton having the other functions, and corresponds to a portion that receives carriers or excitation energy, for example; however, the functions of the portions are not particularly limited, and T and $H_R$ can be the same skeletons in some cases. Similarly, in the luminescent center material 301, a portion denoted by $G_R$ shows a skeleton contributed to acceptance of a carrier or excitation energy in the luminescent center material. A portion denoted by E shows a skeleton having the other functions, and corresponds to a skeleton having a function of light emission, for example; however, the functions of the portions are not particularly limited, and $G_R$ and E can be the same skeletons in some cases.

As shown in FIG. 1B, a light-emitting element includes a structure in which a skeleton $H_R$ donating carriers or excitation energy of a host material and a skeleton $G_R$ accepting carriers or excitation energy of a luminescent center material are formed to be adjacent to each other in a light-emitting layer. With this light-emitting element, carriers recombined in the host material or excitation energy can be effectively transferred to the luminescent center material, whereby the internal quantum efficiency can be improved, which leads to an improvement of the luminous efficiency of the light-emitting element.

As a combination of a host material and a luminescent center material which can have such an arrangement, a combination of materials in which part of a skeleton of a host material and part of a skeleton of a luminescent center material are similar or the same can be given. For example, it is considered that when a host material and a luminescent center material, each having a skeleton formed of a planar condensed ring are formed, the condensed ring portions are easily Ruined to be adjacent to each other. Then, carriers or excitation energy can be effectively given and received through the condensed ring portions. Examples of such a skeleton formed of a planar condensed ring are an anthracene skeleton, a pyrene skeleton, a triphenylene skeleton, and the like.

Similarly, in the case of a host material and a luminescent center material, each having a heterocyclic ring skeleton, it is considered that the heterocyclic ring skeleton portions of the host material and the luminescent center material are easily formed to be adjacent to each other; therefore, carriers or excitation energy can be effectively given and received through the heterocyclic ring skeleton portions.

Further, it is considered that a host material having two nitrogen atoms such as a quinoxaline skeleton is similar to an iridium complex having, as a ligand, a molecular including two nitrogen atoms in that a heterocyclic ring skeleton having two nitrogen atoms is included. It is considered that the portions of the host material and the iridium complex, which are similar to each other, are easily formed to be adjacent to each other. Thus, carriers or excitation energy can be effectively given and received from the host material to the luminescent center material through the portions.

In order that carriers are easily transferred from the host material to the luminescent center material, it is preferable that the direction of a plane surface of a condensed ring or a heterocyclic ring (the direction of π conjugation) in the host be the same as the direction of a plane surface of a condensed ring or a heterocyclic ring (the direction of π conjugation) in the guest as much as possible. Further, in that case, it is preferable that the condensed ring or the heterocyclic ring be a substituent with a lowest excitation level in a molecule.

Note that when a guest material is excited in a state where a plane surface of the condensed ring of the guest is overlapped with a plane surface of a condensed ring of a material other than the guest material (a state of stacking) or in a state where a plane surface of the heterocyclic ring of the guest is overlapped with a plane surface of a heterocyclic ring of a material other than the guest material (a state of stacking), the guest material and the other material might form an exciplex. In that case, an exciton with more stable level than that of excitation energy of the original guest material is formed and light emission having a wavelength longer than the emission spectrum of the original guest material might be obtained.

Therefore, when light emission only from the guest material is required, even if the condensed rings are adjacent to each other, the condensed rings are preferably designed so as not to overlap with each other in order that the condensed rings do not become stacking. For that purpose, an appropriate substituent may be introduced to these condensed rings.

Such a stack of the host material and the luminescent center material can be manufactured in a manner similar to that described in FIG. 1A.

Figure 1C:
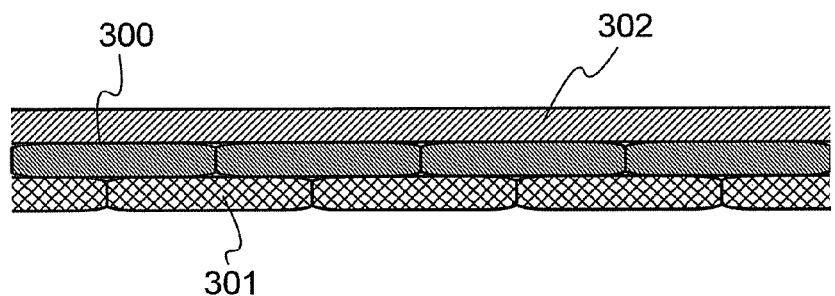

In FIG. 1C, a layer formed of a composite material 302 in which an acceptor substance is included in a substance with a high hole-transport property is further provided over the stack of the monomolecular layer of the host material 300 and the monomolecular layer of the luminescent center material 301, in order to improve a carrier injection property to the stack. With such a structure, carriers are smoothly injected to the stack, which contributes to a reduction in a driving voltage of the light-emitting element.

Note that in this specification, a "composition material" does not simply refer to a material in which two materials are mixed but refers to a material in a state where charges can be given and received between materials by mixing a plurality of materials. In some cases, the giving and receiving of charges includes giving and receiving of charges realized only in the case where there is an auxiliary effect of an electric field.

As the acceptor substance that can be used in the composite material, organic compounds such as 7,7,8,8-tetracyano-2,3,5,6-tetrafluoroquinodimethane (abbreviation: $F_4$-TCNQ), chloranil, and the like are given. Further, a transition metal oxide can be given. Furthermore, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because of their high electron-accepting properties. Among these, molybdenum oxide is especially preferable because it is stable in the air and is easily treated because of its low hygroscopic property.

As the substance having a high hole-transport property used for the composite material, various compounds such as an aromatic amine compound, a carbazole compound, aromatic hydrocarbon, and a high molecular compound (such as an oligomer, a dendrimer, and a polymer) can be used. An organic compound used for the composite material is preferably an organic compound having a high hole-transport property. Specifically, a substance having a hole mobility of higher than or equal to $10^{-6}$ cm$^2$/Vs is preferably used. However, any substance other than the above substances may also be used as long as it has a higher hole-transport property than an electron-transport property. An organic compound, which can be used as a substance having a high hole-transport property for the composite material, will be specifically given below.

As aromatic amine compounds, for example, there are N,N'-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-[bis(3-methylphenyl)amino]phenyl]-N,N'-diphenyl-[1,1'-biphenyl]-4,4'-diamine (abbreviation: DNTPD), 1,3,5-tris[N-(4-diphenylaminophenyl)-N-phenylamino]benzene (abbreviation: DPA3B), and the like.

Examples of the carbazole compound which can be used for the composite material include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

In addition, examples of the carbazole compound which can be used for the composite material include 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbon which can be used for the composite material include 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tertbutylanthracene (abbreviation: t-BuAnth); 9,10-bis(4-methyl-1-naphthyl)anthracene (abbreviation: DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene, and 2,5,8,11-tetra(tert-butyl)perylene. Besides those, pentacene, coronene, or the like can also be used. In particular, the aromatic hydrocarbon which has a hole mobility higher than or equal to $1\times10^{-6}$ cm$^2$/Vs and which has 14 to 42 carbon atoms is particularly preferable.

The aromatic hydrocarbon which can be used for the composite material may have a vinyl skeleton. As the aromatic hydrocarbon having a vinyl group, the following are given for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

Moreover, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), or poly[N,N'-bis(4-butylphenyl)-N,N-bis(phenyl)benzidine] (abbreviation: Poly-TPD) can also be used.

Figure 2:
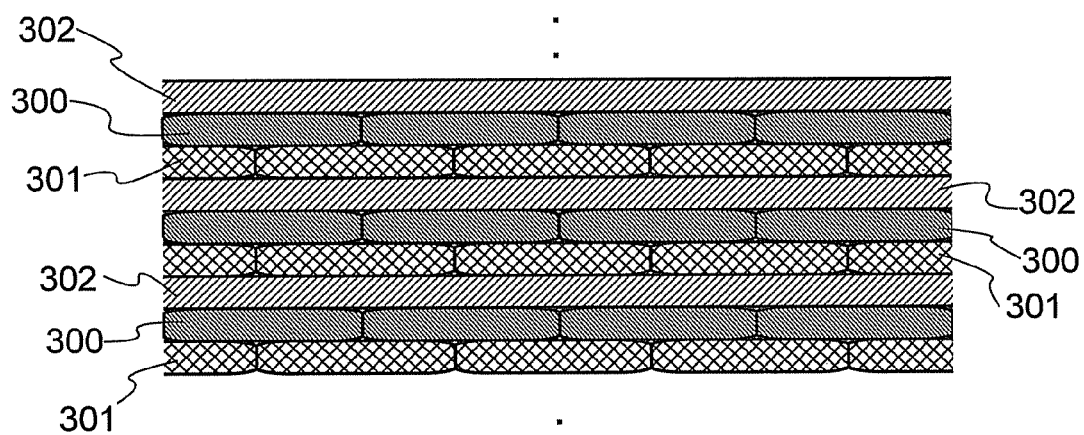
FIG. 2 is a conceptual view of the present invention.

FIG. 2 shows a layered structure of a plurality of stacks of the composite material 302, the host material 300, and the luminescent center material 301 in FIG. 1C. When a plurality of stacks is stacked, carriers that cannot be completely trapped in one stack can be trapped in the next stack, so that carriers penetrating the light-emitting layer can be drastically reduced. Thus, the flow of a wasted current can be suppressed, which leads to an improvement in the internal light emission efficiency. When forming a stack, a plurality of stacks in which a layer formed of a composite material, a monomolecular layer of a host material, and a monomolecular layer of a luminescent center material are stacked in this order is stacked. In that case, a monomolecular layer of the luminescent center material in an n-th stack and a layer of the composite material in an (n+1)-th stack share the same interface. Note that a layer formed of a material with a carrier-transport property (e.g., a layer of the host material) may be interposed between the n-th stack and the (n+1)-th stack.

Despite fears of an increase in a driving voltage by forming such a plurality of stacks, the layer formed of the composite material 302 enables the plurality of stacks to be formed without an extra increase in the driving voltage.

The total thickness of the stacks is preferably greater than or equal to 30 nm and less than or equal to 200 nm. This is because carrier balance is easily achieved when the total thickness is greater than or equal to 30 nm and a driving voltage suitable for a light-emitting element is easily kept when the total thickness is less than or equal to 200 nm.

A light-emitting element with the above-described structure can have high internal quantum efficiency and luminous efficiency.

(Embodiment 2)

In this embodiment, 9-[4-(10-phenyl-9-anthryl)phenyl]-9H-carbazole (abbreviation: CzPA) was used for a host material and N,N,N',N'-tetraphenylpyrene-1,6-diamine (abbreviation: 1,6DPhAPrn) was used for a luminescent center material, and the orientation of 1,6DPhAPrn, by which light emitted from CzPA can be easily absorbed was analyzed by the quantum chemistry calculation. Molecular structures of the materials are shown in the following structural formulae.

[Chemical Formula 1]

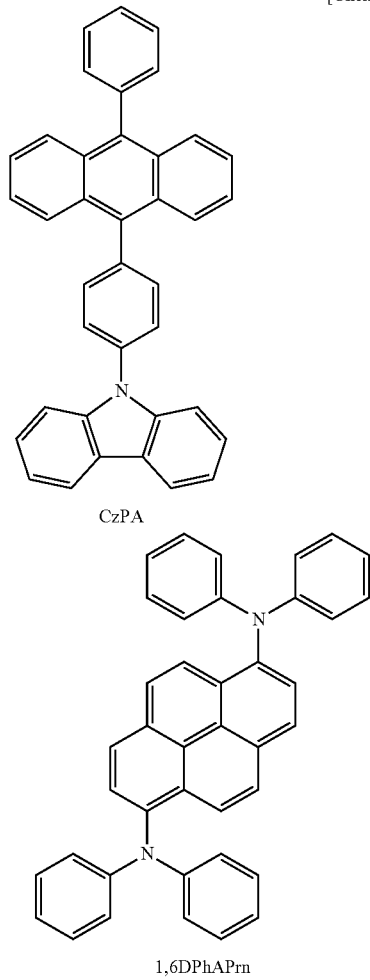

CzPA 1,6DPhAPrn

In the calculation, the molecular structures were optimized and then the transition dipole moment of light emission of the host material and the transition dipole moment of absorption of the luminescent center material were analyzed. Moreover, a molecular orbital related to the transition was analyzed.

The density functional theory (DFT) using Gaussian basis was employed for the structure optimization calculation. The time-dependent density functional theory (TDDFT) was employed for the calculation of the transition dipole moment. In the DFT, an exchange-correlation interaction is approximated by a functional (a function of a function) of one electron potential represented in terms of electron density to enable highly speed calculations. Here, B3LYP that is a hybrid functional was used to specify the weight of each parameter related to exchange-correlation energy. In addition, as a basis set, 6-311G (a basis set of a triple-split valence basis set using three contraction functions for each valence orbital) was applied to all the atoms. By the above basis set, for example, orbitals of 1s to 3s are considered in the case of hydrogen atoms while orbitals of 1s to 4s and 2p to 4p are considered in the case of nitrogen atoms. Furthermore, to improve calculation accuracy, the p function and the d function as polarization basis sets were added to hydrogen atoms and atoms other than hydrogen atoms, respectively, and the p orbital and the d orbital were considered.

Gaussian 09 was used as a quantum chemistry computational program. A high performance computer (manufactured by SGI Japan, Ltd., Altix 4700) was used for the calculations.

Figure 14:
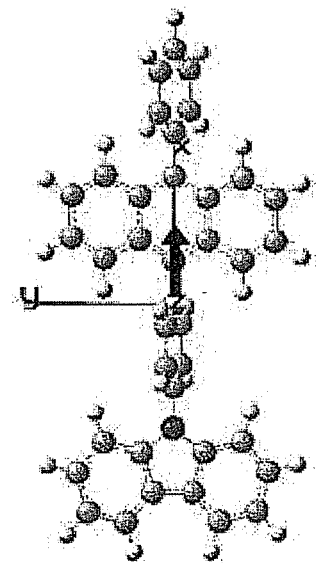
FIG. 14 shows the direction of a transition dipole moment of CzPA.

The singlet excited state of CzPA was analyzed by the calculation. The first excited state is a transition between the highest occupied molecular orbital (HOMO) and the lowest unoccupied molecular orbital (LUMO). A transition dipole moment of light emission related to the transition is shown in FIG. 14. The transition dipole moment exists on a long axis (X-axis) of the molecule and the direction is shown by an arrow in FIG. 14.

Figure 15A:
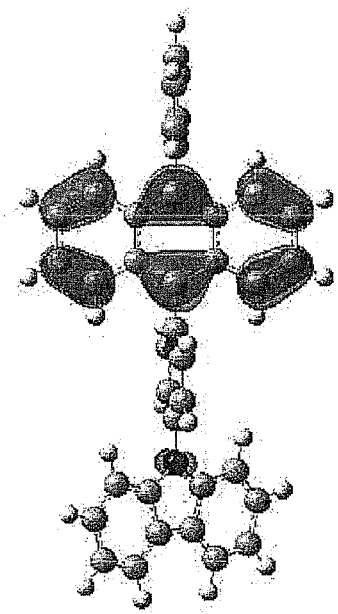
FIGS. 15A and 15B show HOMO and LUMO of CzPA.
Figure 15B:
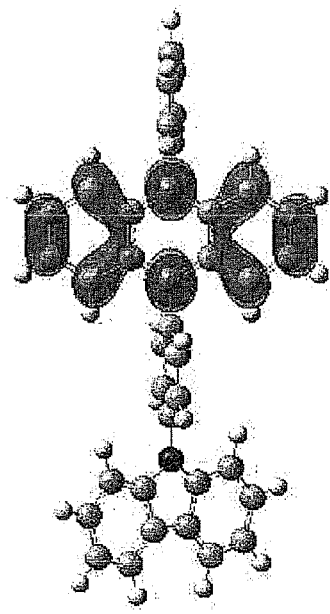

The highest occupied molecular orbital (HOMO) and the lowest unoccupied molecular orbital (LUMO) in the most stable structure obtained by the calculation to optimize the structure of CzPA are visualized by Gauss View 5.0.8 and shown in FIGS. 15A and 15B. FIG. 15A shows the highest occupied molecular orbital (HOMO), and FIG. 15B shows the lowest unoccupied molecular orbital (LUMO). The spheres in the figures represent atoms that constitute CzPA, and cloud-like objects around the atoms represent the highest occupied molecular orbital (HOMO) or the lowest unoccupied molecular orbital (LUMO).

From FIGS. 15A and 15B, the highest molecular occupied orbital exists around an anthracene skeleton in CzPA, so that it is found that an anthracene skeleton largely contributes to the hole-injection property of CzPA. In addition, the lowest molecular unoccupied orbital also exists around an anthracene skeleton, so that it is found that an anthracene skeleton largely contributes to the electron-transport property of CzPA.

Figure 16:
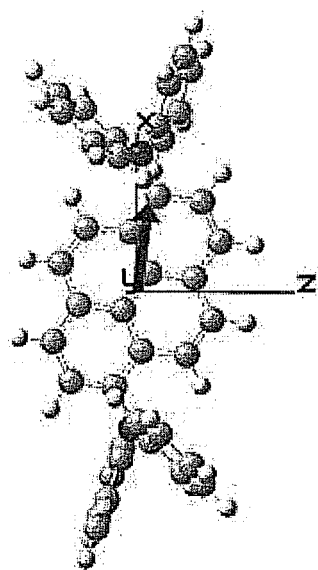
FIG. 16 shows the direction of a transition dipole moment of 1,6DPhAPrn.

Next, the singlet excited state of 1,6DPhAPrn was analyzed by the calculation. The first excited state was a transition between the highest occupied molecular orbital (HOMO) and the lowest unoccupied molecular orbital (LUMO). A transition dipole moment of absorption related to the transition is shown in FIG. 16. The transition dipole moment exists on a plane surface (X-Z plane) of a pyrene group and the direction is shown by an arrow in FIG. 16.

Figure 17A:
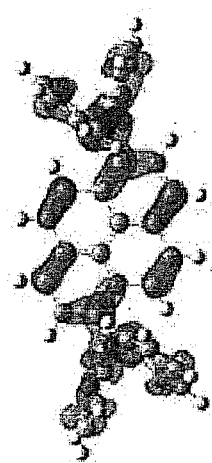
FIGS. 17A and 17B show HOMO and LUMO of 1,6DPhAPrn.
Figure 17B:
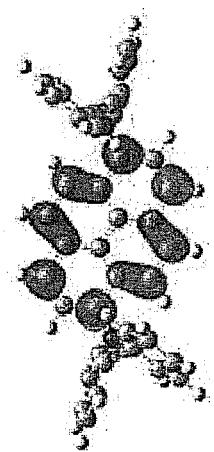

The highest occupied molecular orbital (HOMO) and the lowest unoccupied molecular orbital (LUMO) in the most stable structure of 1,6DPhAPrn are shown in FIGS. 17A and 17B. FIG. 17A shows the highest occupied molecular orbital (HOMO) and FIG. 17B shows the lowest unoccupied molecular orbital (LUMO).

From FIGS. 17A and 17B, the highest occupied molecular orbital exists around a pyrenyl group or a phenyl group in 1,6DPhAPrn, so that it is found that the pyrenyl group or the phenyl group largely contributes to the hole-transport property of 1,6DPhAPrn. In addition, the lowest unoccupied molecular orbital exists around a pyrenyl group, so that it is found that a pyrenyl group largely contributes to the electron-transport property of 1,6DPhAPrn.

When the direction of the transition dipole moment of a molecule and the direction of polarization of light are the same, the transition probability is maximized and light is absorbed or emitted. Therefore, when the direction of polarization of light emitted from a host material is the same as the direction of the transition dipole moment of absorption of a luminescent center material, light is easily absorbed and the energy transfer efficiency is increased.

Figure 18:
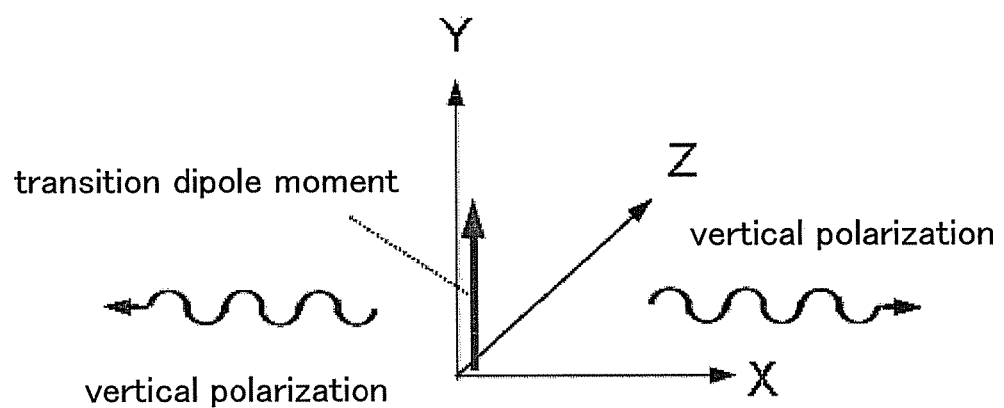
FIG. 18 shows the direction of a transition dipole moment and the direction of polarization of light emission.

Assuming that the transition dipole moment of light emission exists on a Y-axis direction as in FIG. 18, light is emitted to a direction in the X-Z plane with electronic transition. The direction of polarization of light is vertical and light is not emitted to the Y-axis direction.

Figure 19:
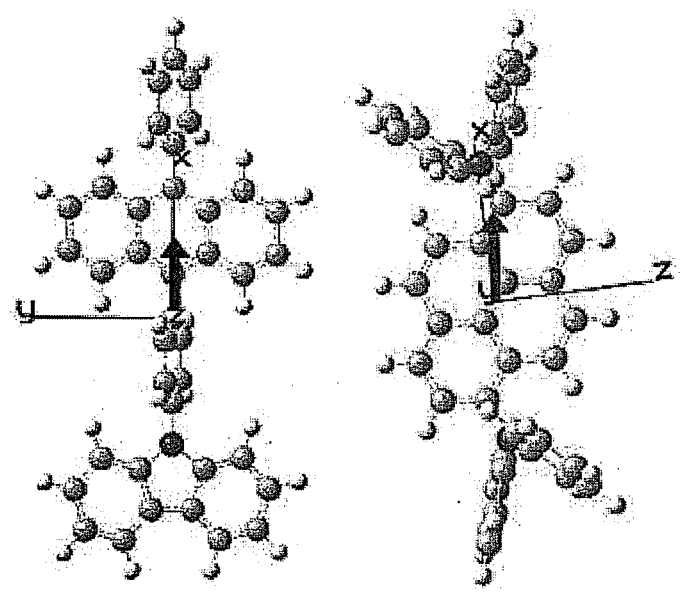
FIG. 19 shows the ideal arrangement of CzPA and 1,6DPhAPrn in view of giving and receiving of energy.

Consequently, when the directions of the transition dipole moments are arranged in parallel, the energy transfer efficiency between CzPA that is a host material and 1,6DPhAPm that is a luminescent center material is high as shown in FIG. 19. Further, when portions related to carrier transport in both molecules are close to each other, an improvement in carrier mobility is expected.

By applying the above-described calculation results to the light-emitting element in Embodiment 1, a light-emitting element in which excitation energy can be easily transferred from a host material to a luminescent center material can be provided. In other words, in the light-emitting element described in Embodiment 1, the direction of the transition dipole moment of light emission of a host material is preferably approximately in parallel to a monomolecular layer, and ideally in parallel to the monomolecular layer. In addition, the direction of the transition dipole moment of electronic transition of a luminescent center material is preferably close to in parallel to a monomolecular layer, and ideally in parallel to the monomolecular layer.

Figure 20A:
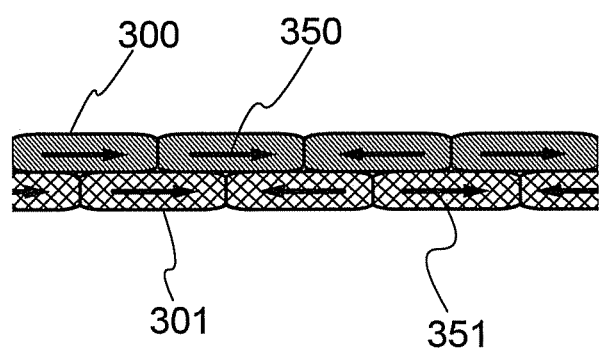
FIGS. 20A and 20B each show the favorable direction of a transition dipole moment of a host material and a luminescent center material.
Figure 20B:
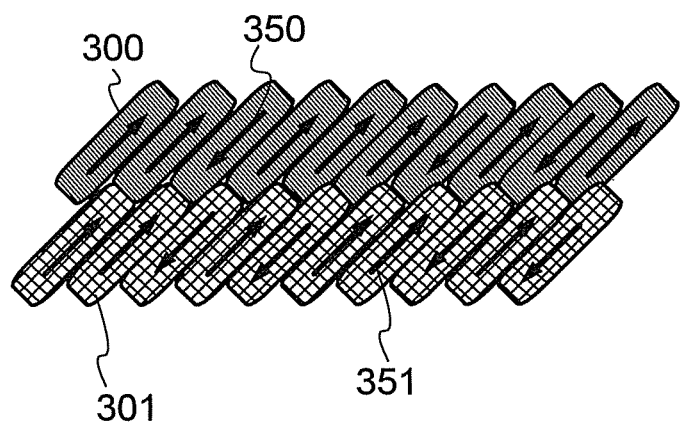

Conceptual views are shown in FIGS. 20A and 20B. Reference numerals 300, 301, 350, and 351 denote the host material, the luminescent center material, a transition dipole moment of light emission of the host material, and a transition dipole moment of absorption of the luminescent center material, respectively. Note that the direction of the transition dipole moment corresponds to the direction of arrows. As shown in FIG. 20A, the transition dipole moment of the host material and the transition dipole moment of the luminescent center material are ideally in parallel to respective monomolecular layers. When the transition dipole moments are in parallel to the monomolecular layers, the directions does not matter. When the monomolecular layers are provided to have an angle to a substrate as shown in FIG. 20B, a distance for absorbing light emitted from the host material becomes long but the transition efficiency is good (although which is not as favorable as that of FIG. 20A) because the directions of polarization of light emission are the same in the host material.

Figure 21:
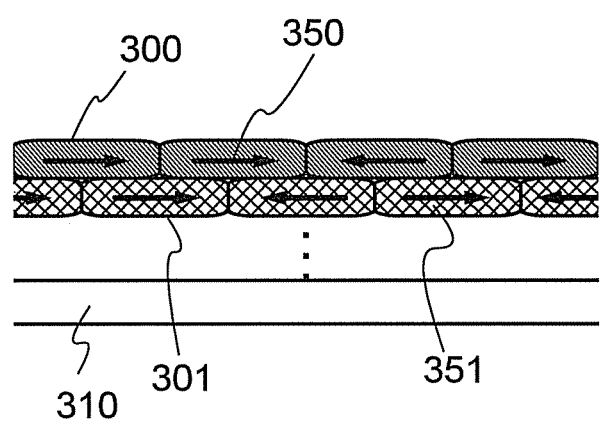
FIG. 21 shows the ideal arrangement related to the position of a substrate and the direction of a transition dipole moment of light emission of the luminescent center material.

Further, since light is emitted to be perpendicular to the transition dipole moment of light emission, it is preferable that the direction of the transition dipole moment 351 of electronic transition of the luminescent center material 301 be in parallel to a substrate 310 as much as possible as shown in FIG. 21, in order to extract light emitted from the luminescent center material effectively from the light-emitting element. Thus, the light extraction efficiency can be improved and the external quantum efficiency is improved, whereby a light-emitting element with higher luminous efficiency can be obtained. Note that the other EL layer or an electrode is provided between the luminescent center material 301 and the substrate 310.

(Embodiment 3)

Figure 3A:
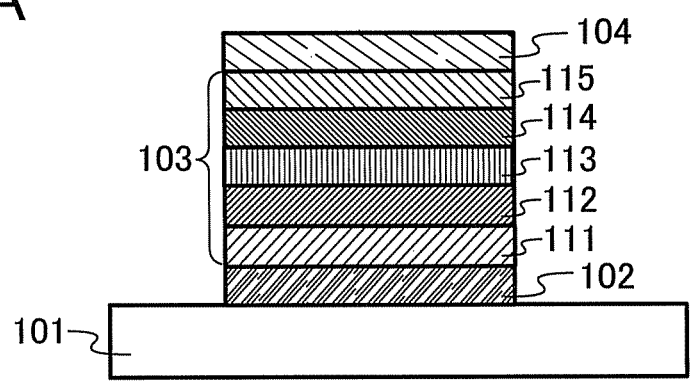
FIGS. 3A and 3B each show a light-emitting element of the present invention.

In this embodiment, a specific structure of a light-emitting element having the structure described in Embodiment 1 is described with reference to FIG. 3A.

The light-emitting element of the present invention includes a plurality of layers between a pair of electrodes. The plurality of layers is a stack of layers each formed of substances having a high carrier-injection property or a high carrier-transport property so that a light-emitting region is formed away from the electrodes, that is, carriers are recombined in a portion away from the electrodes.

In this embodiment, the light emitting element includes a first electrode 102, a second electrode 104, and an EL layer 103 provided between the first electrode 102 and the second electrode 104. Note that in description of this embodiment, the first electrode 102 functions as an anode and the second electrode 104 functions as a cathode. That is, in the following description, it is assumed that when voltage is applied to the first electrode 102 and the second electrode 104 so that a potential of the first electrode 102 is higher than a potential of the second electrode 104, light is emitted.

A substrate 101 is used as a support of the light-emitting element. For the substrate 101, glass, plastic, metal, or the like can be used, for example. Note that materials other than these can be used as long as they can function as a support of a light-emitting element. Note that when light emission from the light-emitting element is extracted outside through the substrate 101, the substrate 101 is preferably a light-transmitting substrate. Further, in the case of using a substrate through which water easily passes, such as a plastic substrate, it is preferable to use the substrate over which a protective film with small moisture permeability is formed.

The first electrode 102 is preferably formed using any of metals, alloys, or conductive compounds, a mixture thereof, or the like with a high work function (specifically, a work function of greater than or equal to 4.0 eV is preferable). For example, indium oxide-tin oxide (ITO: indium tin oxide), indium oxide-tin oxide containing silicon or silicon oxide, indium oxide-zinc oxide (IZO: indium zinc oxide), indium oxide containing tungsten oxide and zinc oxide (IWZO), and the like are given. Such conductive metal oxide films are generally formed by a sputtering method, but may also be formed by an ink-jet method, a spin coating method, or the like by application of a sol-gel method or the like. For example, indium oxide-zinc oxide (IZO) can be formed by a sputtering method using indium oxide to which zinc oxide of 1 wt % to 20 wt % is added, as a target. Further, indium oxide including tungsten oxide and zinc oxide (IWZO) can be formed by a sputtering method using indium oxide to which tungsten oxide of 0.5 wt % to 5 wt % and zinc oxide of 0.1 wt % to 1 wt % are added, as a target. Besides, gold (Au), platinum (Pt), nickel (Ni), tungsten (W), chromium (Cr), molybdenum (Mo), iron (Fe), cobalt (Co), copper (Cu), palladium (Pd), titanium (Ti), graphene, nitride of a metal material (e.g., titanium nitride), and the like are given.

In the case where a layer including the composite material described in Embodiment 1 is used as a layer in contact with the first electrode 102, various metals, alloys, electrically conductive compounds, or a mixture thereof can be used for the first electrode 102 regardless of whether the work function is small or large. For example, aluminum (Al), silver (Ag), an alloy including aluminum (AlSi), or the like can be used.

Besides, an element belonging to Group 1 or Group 2 of the periodic table, which has a low work function, i.e., an alkali metal such as lithium (Li) or cesium (Cs); an alkaline earth metal such as magnesium (Mg), calcium (Ca), or strontium (Sr), an alloy including them (e.g., MgAg or AlLi); a rare earth metal such as europium (Eu) or ytterbium (Yb), an alloy including them; or the like can be used. A film of an alkali metal, an alkaline earth metal, or an alloy including these metals can be formed by a vacuum evaporation method. An alloy containing an alkali metal or an alkaline earth metal can be formed by a sputtering method. Further, a silver paste or the like can be formed by an ink-jet method or the like.

The EL layer 103 described in this embodiment includes a hole-injection layer 111, a hole-transport layer 112, a light-emitting layer 113, an electron-transport layer 114, and an electron-injection layer 115. The EL layer 103 includes at least a light-emitting layer, and there is no particular limitation on a structure of the other stacked layers. In other words, there is no particular limitation on the stacked structure of the EL layer 103. Layers formed of a substance with a high electron-transport property, a substance with a high hole-transport property, a substance with a high electron-injection property, a substance with a high hole-injection property, a bipolar substance (a substance having high electron-transport and high hole-transport properties), a substance with a high light-emitting property may be combined with the light-emitting layer 113 having the structure described in Embodiment 1 as appropriate to form the EL layer 103. For example, the EL layer 103 may be formed by combining a hole-injection layer, a hole-transport layer, a light-emitting layer, an electron-transport layer, an electron-injection layer, and the like, as appropriate. Specific materials to form each of the layers are given below.

The hole-injection layer 111 is a layer containing a substance with a high hole-injection property. As a substance with a high hole-injection property, molybdenum oxide, vanadium oxide, ruthenium oxide, tungsten oxide, manganese oxide, or the like can be used. Besides, as a low molecular organic compound, the following compounds are given: phthalocyanine-based compounds such as phthalocyanine (abbreviation: $H_2Pc$), copper(II) phthalocyanine (abbreviation: CuPc), and vanadyl phthalocyanine (abbreviation: VOPc); aromatic amine compounds such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1), and the like.

Further, as the hole-injection layer 111, the composite material described in detail in Embodiment 1 can also be used, and a repeated description is omitted. The corresponding description in Embodiment 1 is to be referred to. Note that by using the composite material, a material for forming an electrode may be selected regardless of the work function as described above. In other words, besides a material with a high work function, a material with a low work function may also be used as the first electrode 102. Such a composite material can be formed by co-deposition of a substance with a high hole-transport property and an acceptor substance.

The hole-transport layer 112 is a layer including a substance with a high hole-transport property. As the substance with a high hole-transport property, the following low molecular organic compound can be used: an aromatic amine compound such as NPB (or α-NPD), TPD, 4,4'-bis[N-(9,9-dimethylfluoren-2-yl)-N-phenylamino]biphenyl (abbreviation: DFLDPBi), 4,4'-bis[N-(spiro-9,9'-bifluoren-2-yl)-N-phenylamino]biphenyl (abbreviation: BSPB), 4,4',4"-tris[N-(3-methylphenyl)-N-phenylamino]triphenylamine (abbreviation: m-MTDATA), N-[4-(9H-carbazol-9-yl)phenyl]-N-phenyl-spiro-9,9'-bifluoren-2-amine (abbreviation: YGASF), N,N'-bis[4-(9H-carbazol-9-yl)phenyl-N,N'-diphenylvinyl-4,4'-diamine (abbreviation: YGABP), 4-(9H-carbazol-9-yl)-2'-phenyltriphenylamine (abbreviation: o-YGA1BP), 4-(9H-carbazol-9-yl)-3'-phenyltriphenylamine (abbreviation: m-YGA1BP), 4-(9H-carbazol-9-yl)-4'-phenyltriphenylamine (abbreviation: p-YGA1BP), 1,3,5-tri(N-carbazolyl)benzene (abbreviation: TCzB), or 4,4',4"-tris(N-carbazolyl)triphenylamine (abbreviation: TCTA). The substances given here are mainly substances each having a hole mobility of higher than or equal to $10^{-6}$ $cm^2/Vs$. However, any substance other than the above substances may also be used as long as it is a substance with a higher hole-transport property than an electron-transport property. The layer including a substance with a high hole-transport property is not limited to a single layer, and a stacked layer of two or more layers formed of the above materials may also be used.

Alternatively, for the hole-transport layer 112, a high molecular compound such as PVK, PVTPA, PTPDMA, or Poly-TPD can be used.

The light-emitting layer 113 is a layer including a luminescent center material formed of a substance having a high light-emitting property, and various materials can be used for the light-emitting layer 113. As the luminescent center material, for example, a fluorescent compound exhibiting fluorescence or a phosphorescent compound exhibiting phosphorescence can be used.

Examples of a phosphorescent compound which can be used for the light-emitting layer are given below. As a material for blue light emission, bis[2-(4',6'-difluorophenyl)pyridinato-N,$C^{2'}$]iridium(III)tetrakis(1-pyrazolyl)borate (abbreviation: FIr6), bis[2-(4',6'-difluorophenyl)pyridinato-N,$C^{2'}$]iridium(III)picolinate (abbreviation: FIrpic), bis[2-(3',5'bistrifluoroethylphenyl)pyridinato-N,$C^{2'}$]iridium(III) picolinate (abbreviation: $Ir(CF_3\ ppy)_2(pic)$), bis[2-(4',6'-difluorophenyl)pyridinato-N,$C^{2'}$]ridium(III)acetylacetonate (abbreviation: FIr(acac)), or the like is given. As a material for green light emission, tris(2-phenylpyridinato-N,$C^{2'}$)iridium (III) (abbreviation: $Ir(ppy)_3$), bis[2-phenylpyridinato-N,$C^{2'}$]iridium(III)acetylacetonate (abbreviation: $Ir(ppy)_2(acac)$), bis(1,2-diphenyl-1H-benzimidazolato)iridium(III)acetylacetonate (abbreviation: $Ir(pbi)_2(acac)$), bis(benzo[h]quinolinato)iridium(III)acetylacetonate (abbreviation: $Ir(bzq)_2(acac)$), or the like is given. As a material for yellow light emission, bis(2,4-diphenyl-1,3-oxazolato-N, $C^{2'}$)iridium(III) acetylacetonate (abbreviation: $Ir(dpo)_2(acac)$), bis[2-(4'-perfluorophenylphenyl)pyridinato]iridium(III)acetylacetonate (abbreviation: $Ir(p-PF-ph)_2(acac)$), bis(2-phenylbenzothiazolato-N,$C^{2'}$)iridium(III)acetylacetonate (abbreviation: $Ir(bt)_2(acac)$), or the like is given. As a material for orange light emission, tris(2-phenylquinolinato-N,$C^{2'}$)iridium(III) (abbreviation: $Ir(pq)_3$), bis(2-phenylquinolinato-N,$C^{2'}$)iridium(III)acetylacetonate (abbreviation: $Ir(pq)_2(acac)$), or the like is given. As a material for red light emission, an organometallic complex such as bis[2-(2'-benzo[4,5-α]thienyl)pyridinato-N, $C^{3'}$]iridium(III)acetylacetonate (abbreviation: $Ir(btp)_2(acac)$), bis(1-phenylisoquinolinato-N,$C^{2'}$)iridium (III)acetylacetonate (abbreviation: $Ir(piq)_2(acac)$), (acetylacetonato)bis[2,3-bis(4-fluorophenyl)quinoxalinato]iridium (III) (abbreviation: $Ir(Fdpq)_2(acac)$), 2,3,7,8,12,13,17,18-octaethyl-21H,23H-porphyrin platinum(II) (abbreviation: PtOEP), or the like is given. In addition, a rare earth metal complex such as tris(acetylacetonato) (monophenanthroline) terbium(III) (abbreviation: $Tb(acac)_3(Phen)$), tris(1,3-diphenyl-1,3-propanedionato) (monophenanthroline)europium (III) (abbreviation: $Eu(DBM)_3(Phen)$), or tris[1-(2-thenyl)-3,3,3-trifluoroacetonato] (monophenanthroline)europium(III) (abbreviation: $Eu(TTA)_3(Phen)$) performs light emission (electron transition between different multiplicities) from a rare earth metal ion; thus, such a rare earth metal complex can be used as a phosphorescent compound.

Examples of fluorescent compounds that can be used for the light-emitting layer are given below. Examples of materials for blue light emission are as follows: N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA); N,9-diphenyl-N-[4-(10-phenyl-9-anthryl)phenyl]-9H-carbazol-3-amine (abbreviation: PCAPA); perylene; 2,5,8,11-tetra-tert-butylperylene (abbreviation: TBP); 4-(10-phenyl-9-anthryl)-4'-(9-phenyl-9H-carbazol-3-yl)triphenylamine (abbreviation: PCBAPA); and the like. In addition, as a light-emitting material for green light emission, the following can be used: N-(9,10-diphenyl-2-anthryl)-N,9-diphenyl-9H-carbazol-3-amine (abbreviation: 2PCAPA); N-[9,10-bis(1,1'-biphenyl-2-yl)-2-anthryl]-N,9-diphenyl-9H-carbazol-3-amine (abbreviation: 2PCABPhA); N-(9,10-diphenyl-2-anthryl)-N,N N'-triphenyl-1,4-phenylenediamine (abbreviation: 2DPAPA); N-[9,10-bis(1,1'-biphenyl-2-yl)-2-anthryl]-N,N'-triphenyl-1,4-phenylenediamine (abbreviation: 2DPABPhA); N-[9,10-bis(1,1'-biphenyl-2-yl)]-N-[4-(9H-carbazol-9-yl)phenyl]-N-phenylanthracen-2-amine (abbreviation: 2YGABPhA); N,N,9-triphenylanthracen-9-amine (abbreviation: DPhAPhA); and the like. Further, examples of the materials that emit yellow light include rubrene, 5,12-bis(1,1'-biphenyl-4-yl)-6,11-diphenyltetracene (abbreviation: BPT), and the like. Furthermore, examples of materials for red light emission include N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fiuoranthene-3,10-diamine (abbreviation: p-mPhAFD), and the like.

The above-described luminescent center material and a host material are manufactured to have the structure described in Embodiment 1.

Various materials can be used as the host material. Specifically, metal complex, heterocyclic compounds, and aromatic amine compounds are given, for example. As metal complexes, the following can be given: tris(8-quinolinolato)aluminum(III) (abbreviation: Alq); tris(4-methyl-8-quinolinolato)aluminum(III) (abbreviation: $Almq_3$); bis(10-hydroxybenzo[h]quinolinato)beryllium(II) (abbreviation: $BeBq_2$); bis(2-methyl-8-quinolinolato)(4-phenylphenolato)aluminum(III) (abbreviation: BAlq); bis(8-quinolinolato) zinc(II) (abbreviation: Znq); bis[2-(2-benzoxazolyl)phenolato]zinc(II) (abbreviation: ZnPBO); bis[2-(2-benzothiazolyephenolato]zinc(II) (abbreviation: ZnBTZ); and the like. As heterocyclic compounds, the following can be given: 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 3-(4-biphenylyl)-4-phenyl-5-(4-tert-butylphenyl)-1,2,4-triazole (abbreviation: TAZ); 2,2',2"-(1,3,5-benzenetriyl)tris(1-phenyl-1H-benzimidazole) (abbreviation: TPBI); bathophenanthroline (BPhen); bathocuproine (abbreviation: BCP); 9-[4-(5-phenyl-1,3,4-oxadiazol-2-yl)phenyl]-9H-carbazole (abbreviation: CO11); and the like. As aromatic amine compounds, the following can be given: 4,4'-bis[N-(1-naphthyl)-N-phenylamino]biphenyl (abbreviation: NPB or α-NPD); N,N'-bis(3-methylphenyl)-N,N'-diphenyl-[1,1'-biphenyl]-4,4'-diamine (abbreviation: TPD); 4,4'-bis[N-(Spiro-9,9'-bifluoren-2-yl)-N-phenylamino]-1,1'-biphenyl (abbreviation: BSPB); and the like. In addition, condensed polycyclic aromatic compounds such as anthracene derivatives, phenanthrene derivatives, pyrene derivatives, chrysene derivatives, and dibenzo[g,p]chrysene derivatives are given. Specific examples of the condensed polycyclic aromatic compound include 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3- amine (abbreviation: 2PCAPA), 6,12-dimethoxy-5,11-diphenylchrysene, N,N,N',N',N'',N'',N''',N'''-octaphenyldibenzo[g,p]chrysene-2,7,10,15-tetramine (abbreviation: DBC1), 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3¹-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), and the like. It is preferable to use a substance with the lowest unoccupied molecular orbital (a LUMO level) higher than that of the luminescent center material and the highest occupied molecular orbital (a HOMO level) lower than that of the luminescent center material selected from the above substances and known substances. Note that in this specification, "the HOMO level or the LUMO level is high" means that the energy level is high, while "the HOMO level or the LUMO level is low" means that the energy level is low. For example, it can be said that a substance A having a HOMO level of −5.5 eV has a HOMO level which is lower by 0.3 eV than that of a substance B having a HOMO level of −5.2 eV, and has a HOMO level which is higher by 0.2 eV than that of a substance C having a HOMO level of −5.7 eV.

When materials are selected from the host material and the luminescent center material with such a relation, preferably, materials having similar skeletons are selected, excitation energy is smoothly given and received as described in Embodiment 1. Thus, it is possible to manufacture a light-emitting element with high internal quantum efficiency and high luminous efficiency.

The electron-transport layer 114 is a layer containing a substance with a high electron-transport property. For example, as a low molecular organic compound, metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ) can be used. Further, the following heterocyclic compounds can be also used: 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 3-(4-biphenylyl)-4-phenyl-5-(4-tert-butylphenyl)-1,2,4-triazole (abbreviation: TAZ01); 2,2',2''-(1,3,5-benzenetriyl)-tris(1-phenyl-1H-benzimidazole) (abbreviation: TPBI); bathophenanthroline (abbreviation: BPhen); bathocuproine (abbreviation: BCP); and the like. The substances mentioned here are mainly ones that have an electron mobility higher than or equal to $10^{-6}$ cm$^2$/V·s. Note that the electron-transport layer 114 may be formed of substances other than those described above as long as the substances have higher electron-transport properties than hole-transport properties. Further, the electron-transport layer is not limited to a single layer, and a stacked layer of two or more layers made of the aforementioned substances may be used.

In addition, for the electron-transport layer 114, a high molecular compound can be used. For example, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy), or the like can be used.

The electron-injection layer 115 is a layer including a substance with a high electron-injection property. As the substance with a high electron-injection property, an alkali metal, an alkaline earth metal, or a compound thereof such as lithium (Li), magnesium (Mg), lithium fluoride (LiF), cesium fluoride (CsF), or calcium fluoride (CaF$_2$) can be used. For example, a layer of a material having an electron-transport property containing an alkali metal, an alkaline earth metal, or a compound thereof, such as Alq which contains magnesium (Mg), may be used. By using a layer of a substance having an electron-transport property containing an alkali metal or an alkaline earth metal as the electron-injection layer, electron injection from the second electrode 104 is performed efficiently, which is preferable.

As a substance for forming the second electrode 104, a metal, an alloy, an electrically conductive compound, a mixture thereof, or the like with a low work function (specifically, a work function of lower than or equal to 3.8 eV is preferable) can be used. As a specific example of such a cathode material, an element belonging to Group 1 or 2 in the periodic table, i.e., an alkali metal such as lithium (Li) or cesium (Cs), or an alkaline earth metal such as magnesium (Mg), calcium (Ca), or strontium (Sr); an alloy containing any of these (such as MgAg or AlLi); a rare earth metal such as europium (Eu) or ytterbium (Yb); an alloy containing such a rare earth metal; or the like can be used. A film of an alkali metal, an alkaline earth metal, or an alloy including these metals can be formed by a vacuum evaporation method. An alloy containing an alkali metal or an alkaline earth metal can be formed by a sputtering method. Further, a silver paste or the like can be formed by an ink jet method or the like.

Further, by providing the electron-injection layer 115, which is a layer having a function of promoting injection of electrons, between the second electrode 104 and the electron-transport layer 114, the second electrode 104 can be formed using various conductive materials such as Al, Ag, ITO, or indium oxide-tin oxide containing silicon or silicon oxide, regardless of whether the work function is small or large. Films of these conductive materials can be formed by a sputtering method, an ink-jet method, a spin coating method, or the like.

A variety of methods can be used for forming the EL layer regardless of whether it is a dry process or a wet process. For example, a vacuum evaporation method, an ink-jet method, a spin coating method or the like may be used. A different formation method may be employed for each electrode or each layer. The organic semiconductor material described in Embodiment 1 exhibits a good sublimation property; thus, a favorable film can be formed by an evaporation method by using the organic semiconductor material.

For example, the EL layer may be formed using a high molecular compound by a wet process. Alternatively, the EL layer can be formed using a low molecular organic compound by a wet process. Further alternatively, the EL layer may be formed using a low molecular organic compound by a dry process such as a vacuum evaporation method.

In addition, the electrode may be formed by a wet process using a sol-gel method, or by a wet process using paste of a metal material. Alternatively, the electrode may be foamed by a dry process such as a sputtering method or a vacuum evaporation method.

In the light-emitting element having the above structure, current flows due to a potential difference generated between the first electrode 102 and the second electrode 104 and holes and electrons are recombined in the EL layer 103; thus, light is emitted.

The emitted light is extracted through one or both of the first electrode 102 and the second electrode 104. Accordingly, one or both of the first electrode 102 and the second electrode 104 is/are an electrode having a light-transmitting property. For example, when only the first electrode 102 has a light-transmitting property, light emission is extracted from the substrate side through the first electrode 102. Meanwhile, when only the second electrode 104 has a light-transmitting property, light emission is extracted from the side opposite to the substrate side through the second electrode 104. In the case where each of the first electrode 102 and the second electrode 104 has a light-transmitting property, light emission is extracted from both of the substrate side and the side opposite to the substrate through the first electrode 102 and the second electrode 104.

The structure of the layers provided between the first electrode 102 and the second electrode 104 is not limited to the above structure. Any structure other than the above structure is included in the category of this embodiment as long as a light-emitting region for recombination of holes and electrons is positioned away from the first electrode 102 and the second electrode 104 to prevent quenching caused by proximity of the light-emitting region to metal, and a light-emitting layer having the structure described in Embodiment 1 is provided.

In other words, there is no particular limitation on the stacked structure of the layers; layers formed of a substance having a high electron-transport property, a substance having a high hole-transport property, a substance having a high electron-injection property, a substance having a high hole-injection property, a bipolar substance (a substance having high electron-transport and hole-transport properties), and the like may be combined with a light-emitting layer having the structure described in Embodiment 1 as appropriate to form the stacked structure.

Figure 3B:
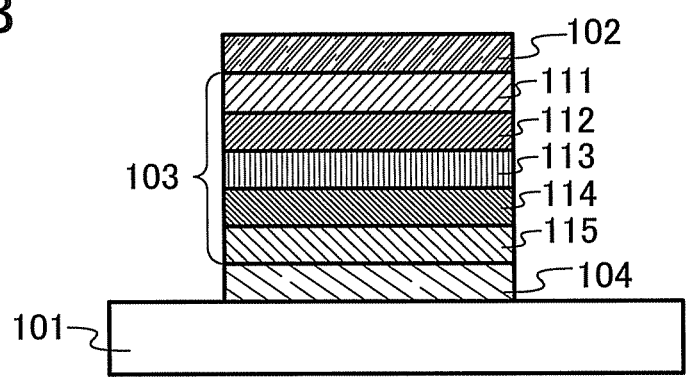

For example, as illustrated in FIG. 3B, a structure may be employed in which the second electrode 104 functioning as a cathode, the EL layer 103, and the first electrode 102 functioning as an anode are stacked in this order over the substrate 101. In FIG. 3B, a structure in which the electron-injection layer 115, the electron-transport layer 114, the light-emitting layer 113, the hole-transport layer 112, and the hole-injection layer 111 are stacked in this order over the second electrode 104 is employed.

In this embodiment, the light-emitting element is formed over a substrate including glass, plastic, or the like. By forming a plurality of such light emitting elements over one substrate, a passive matrix light emitting device can be manufactured. In addition, a thin film transistor (TFT) may be formed over a substrate including glass, plastic, or the like and a light-emitting element may be manufactured over an electrode that is electrically connected to the TFT. In this manner, an active matrix light-emitting device in which the TFT controls the drive of the light-emitting element can be manufactured. Note that the structure of the TFT is not particularly limited. A staggered TFT or an inverted staggered TFT may be used. Further, a driver circuit formed over a TFT substrate may include both n-channel and p-channel TFTs or only one of n-channel and p-channel TFTs. There is no particular limitation on crystallinity of a semiconductor film used for the TFT. An amorphous semiconductor film may be used, or a crystalline semiconductor film may be used. Further, a single crystalline semiconductor film may be used. The single crystalline semiconductor film can be fanned by a Smart Cut (registered trademark) method or the like.

Note that this embodiment can be freely combined with the other embodiments.

(Embodiment 4)

In this embodiment, a mode of a light-emitting element of the present invention having a structure in which a plurality of light-emitting units is stacked (hereinafter, referred to as a stacked-type element) will be described with reference to FIG. 4. The light-emitting element is a stacked-type light-emitting element including a plurality of light-emitting units between a first electrode and a second electrode. A structure of each of the light-emitting units can be similar to the structure of the EL layer 103 described in Embodiment 3. In other words, it can be said that the light-emitting element described in Embodiment 3 is a light-emitting element including one light-emitting unit. In this embodiment, a light-emitting element including a plurality of light-emitting units will be described.

Figure 4:
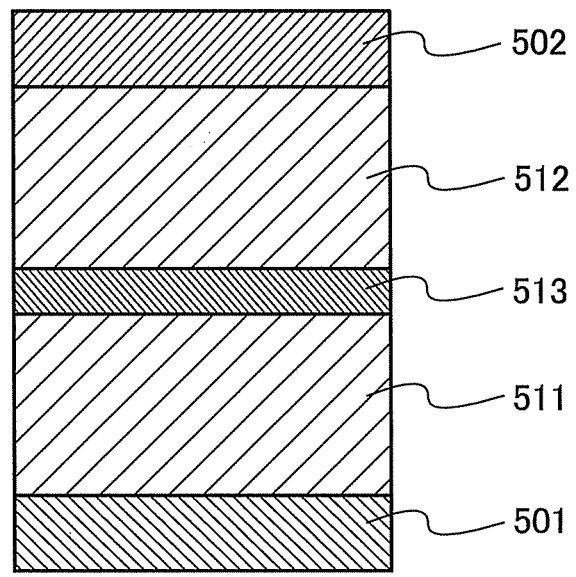
FIG. 4 shows a light-emitting element of the present invention.

In FIG. 4, a first light-emitting unit 511 and a second light-emitting unit 512 are stacked between a first electrode 501 and a second electrode 502. A charge generating layer 513 is provided between the first light-emitting unit 511 and the second light-emitting unit 512. Electrodes similar to those in Embodiment 3 can be applied to the first electrode 501 and the second electrode 502. In addition, the first light-emitting unit 511 and the second light-emitting unit 512 may have the same structure or different structures, and at least one of the first light-emitting unit 511 and the second light-emitting unit 512 has a structure similar to the EL layer 103 described in Embodiment 3.

The charge generating layer 513 is a layer that injects electrons into a light-emitting unit on one side and injects holes into a light-emitting unit on the other side when a voltage is applied to the first electrode 501 and the second electrode 502. The charge generating layer 513 may have a single-layer structure or a stacked structure. As a stacked structure of plural layers, a structure in which a hole-injection layer and an electron-injection layer are stacked is preferable.

As the hole-injection layer, a semiconductor or an insulator, such as molybdenum oxide, vanadium oxide, rhenium oxide, or ruthenium oxide, can be used. Alternatively, the hole-injection layer may have a structure in which an acceptor substance is added into a substance having a high hole-transport property. The layer containing a substance having a high hole-transport property and an acceptor substance is fowled using the composite material described in Embodiment 3 and includes, as an acceptor substance, 7,7,8,8-tetracyano-2,3,5,6-tetrafluoroquinodimethane (abbreviation: $F_4$-TCNQ) or metal oxide such as vanadium oxide, molybdenum oxide, or tungsten oxide. As the substance having a high hole-transport property, various compounds such as aromatic amine compounds, carbazole derivatives, aromatic hydrocarbons, and high molecular compounds (such as oligomers, dendrimers, and polymers) can be used. Note that a substance having a hole mobility higher than or equal to $10^{-6}$ $cm^2/Vs$ is preferably used as the substance having a high hole-transport property. However, any substance other than the above substances may also be used as long as it is a substance whose hole-transport property is higher than the electron-transport property. Since the composite material including the substance having a high hole-transport property and the acceptor substance is superior in carrier-injection property and carrier-transport property, low voltage driving and low current driving can be realized.

As the electron-injection layer, an insulator or a semiconductor, such as lithium oxide, lithium fluoride, or cesium carbonate, can be used. Alternatively, the electron-injection layer may have a structure in which a donor substance is added to a substance having a high electron-transport property. As the donor substance, an alkali metal, an alkaline-earth metal, a rare-earth metal, a metal that belongs to Group 13 of the periodic table, or an oxide or carbonate thereof can be used. Specifically, lithium (Li), cesium (Cs), magnesium (Mg), calcium (Ca), ytterbium (Yb), indium (In), lithium oxide, cesium carbonate, or the like is preferably used. Alternatively, an organic compound such as tetrathianaphthacene may be used as the donor substance. As the substance having a high electron-transport property, the materials described in Embodiment 3 can be used. Note that a substance having a hole mobility higher than or equal to $10^{-6}$ cm$^2$/Vs or more is preferably employed as the substance having a high hole-transport property. Note that any substance that has a higher electron-transport property than a hole-transport property may be used other than the above substances. Since the composite material of the substance having a high hole-transport property and the donor substance has an excellent carrier-injection property and an excellent carrier-transport property, low voltage driving and low current driving can be realized.

Further, the electrode materials described in Embodiment 2 can be used for the charge generating layer 513. For example, the charge generating layer 513 may be formed with a combination of a layer including a substance having a high hole-transport property and a metal oxide with a transparent conductive film. It is preferable that the charge generating layer 513 be a highly light-transmitting layer in view of light extraction efficiency.

In any case, the charge generating layer 513, which is interposed between the first light-emitting unit 511 and the second light-emitting unit 512, is acceptable as long as electrons are injected to a light-emitting unit on one side and holes are injected to a light-emitting unit on the other side when a voltage is applied to the first electrode 501 and the second electrode 502. For example, any structure is acceptable for the charge generating layer 513 as long as the charge generating layer 513 injects electrons and holes into the first light-emitting unit 511 and the second light-emitting unit 512, respectively when applying a voltage so that a potential of the first electrode becomes higher than a potential of the second electrode.

Although this embodiment describes the light emitting element having two light emitting units, the present invention can be similarly applied to a light emitting element in which three or more light emitting units are stacked. By arranging a plurality of light-emitting units between a pair of electrodes so as to be partitioned by a charge-generating layer as in the light-emitting element of this embodiment, the element can perform light emission in a high luminance region while keeping a current density low, whereby the element can have long life. When the light-emitting element is applied for illumination, voltage drop due to resistance of an electrode material can be reduced, thereby achieving homogeneous light emission in a large area. Moreover, a light-emitting device of low power consumption, which can be driven at low voltage, can be achieved.

When the light-emitting units are foiined to emit different colors from each other, the light-emitting unit as a whole can provide light emission of a desired color. For example, in a light-emitting element having two light-emitting units, the emission colors of the first light-emitting unit and the second light-emitting unit are made complementary, so that the light-emitting element which emits white light as the whole element can be obtained. Note that the word "complementary" means color relationship in which an achromatic color is obtained when colors are mixed. That is, when light emitted from substances which emit light of complementary colors are mixed, white light emission can be obtained. This can be applied to a light-emitting element having three light-emitting units in a similar manner. For example, when the emission color of the first light-emitting unit is red light, the emission color of the second light-emitting unit is green light, and the emission color of the third light-emitting unit is blue light, the light-emitting element as a whole can provide white color emission.

Note that this embodiment can be freely combined with the other embodiments.

(Embodiment 5)

In this embodiment, a light-emitting device having the light-emitting element of the present invention will be described.

Figure 5A:
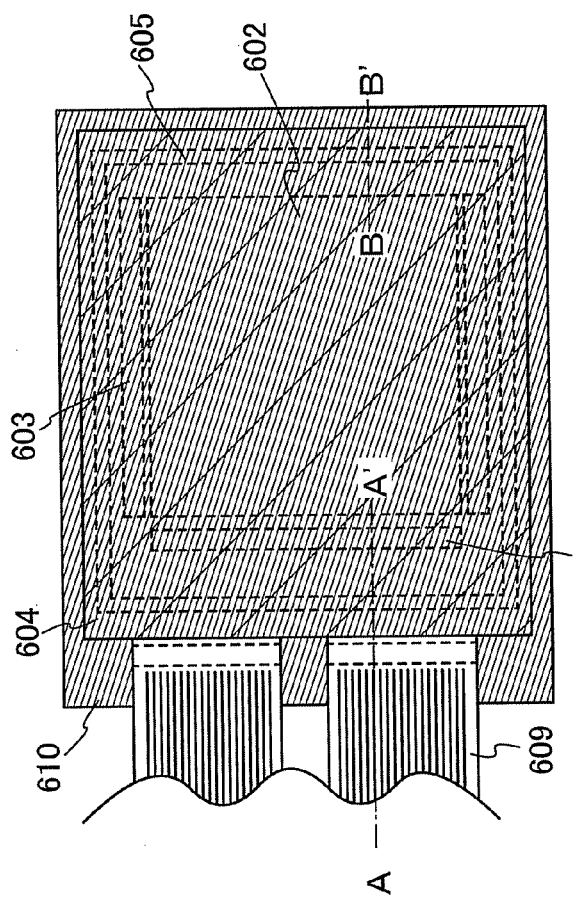
FIGS. 5A and 5B show a light-emitting device of the preset invention.
Figure 5B:
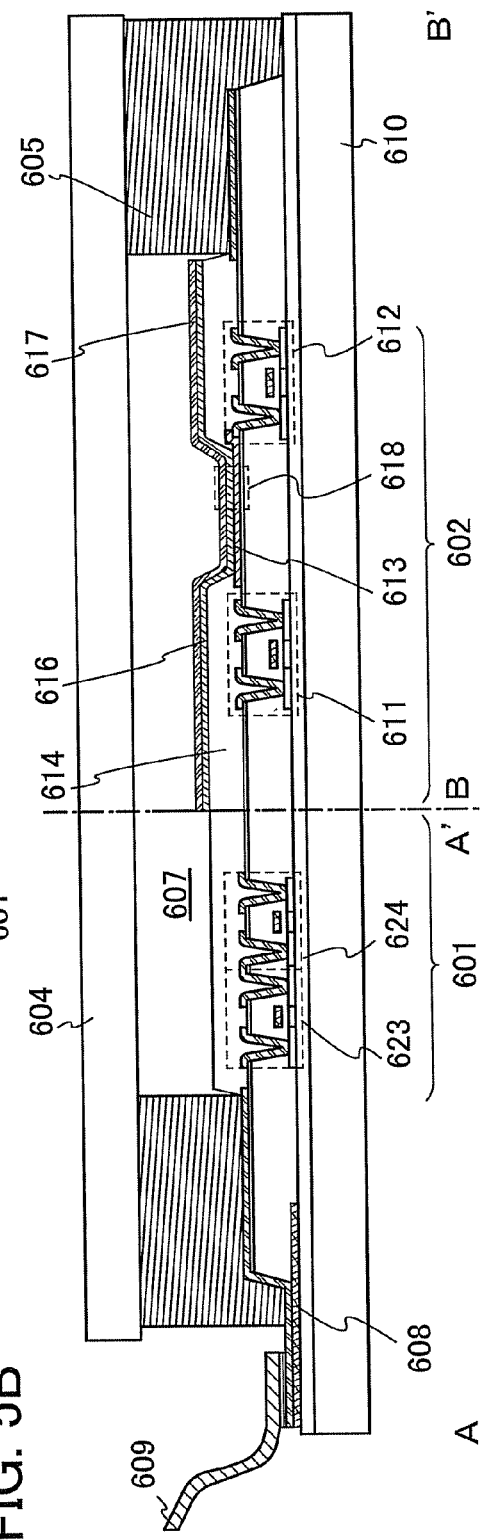

In this embodiment, a light-emitting device having the light-emitting element of the present invention in a pixel portion will be described with reference to FIGS. 5A and 5B. FIG. 5A is a top view of the light-emitting device, and FIG. 5B is a cross-sectional view taken along lines A-A' and B-B' of FIG. 5A. The light-emitting device includes a driver circuit portion (source-side driver circuit) 601, a pixel portion 602, and a driver circuit portion (gate-side driver circuit) 603 which are illustrated with dotted lines. These units control light emission of the light-emitting element. Further, a reference numeral 604 denotes a sealing substrate; 605, a sealing material; and 607, a space surrounded by the sealing material 605.

Reference numeral 608 denotes a wiring for transmitting signals to be inputted to the source side driver circuit portion 601 and the gate side driver circuit portion 603 and receiving signals such as a video signal, a clock signal, a start signal, and a reset signal from an FPC (flexible printed circuit) 609 serving as an external input terminal. Although only the FPC is illustrated here, a printed wiring board (PWB) may be attached to the FPC. The light-emitting device in this specification includes, in its category, not only the light-emitting device itself but also the light-emitting device provided with the FPC or the PWB.

Next, a cross-sectional structure is described with reference to FIG. 5B. The driver circuit portion and the pixel portion are formed over an element substrate 610. Here, the source side driver circuit portion 601, which is the driver circuit portion, and one pixel of the pixel portion 602 are shown.

In the source side driver circuit portion 601, a CMOS circuit is formed in which an n-channel TFT 623 and a p-channel TFT 624 are combined. Such a driver circuit may be formed by using various circuits such as a CMOS circuit, a PMOS circuit, or an NMOS circuit. In this embodiment, a driver-integrated type in which a driver circuit is formed over a substrate provided with a pixel portion is described; however, the present embodiment is not necessarily limited to this type, and the driver circuit can be formed outside the substrate.

The pixel portion 602 includes a plurality of pixels including a switching TFT 611, a current controlling TFT 612, and a first electrode 613 connected electrically with a drain of the current controlling TFT 612. An insulator 614 is formed to cover an end portion of the first electrode 613. Here, the insulator 614 is formed using a positive type photosensitive acrylic resin film.

In order to improve the coverage, the insulator 614 is formed to have a curved surface with curvature at its upper or lower end portion. For example, in the case of using positive photosensitive acrylic for the material of the insulator 614, it is preferable that only the upper end portion of the insulator 614 has a curved surface with a radius of curvature of 0.2 μm to 3 μm. As the insulator 614, either a negative type which becomes insoluble in etchant by light irradiation or a positive type which becomes soluble in etchant by light irradiation can be used.

An EL layer 616 and a second electrode 617 are formed over the first electrode 613. Here, the first electrode 613 can be formed using various metals, alloys, electrically conductive compounds, or mixture thereof. If the first electrode 613 is used as an anode, it is preferable to use, among those materials, a metal, an alloy, an electrically conductive compound, a mixture thereof, or the like with a high work function (preferably, a work function higher than or equal to 4.0 eV). For example, the first electrode 613 can be formed using a single-layer film of an indium tin oxide film containing silicon, an indium zinc oxide film, a titanium nitride film, a chromium film, a tungsten film, a Zn film, a Pt film, or the like; or a stacked film such as a stack of a titanium nitride film and a film containing aluminum as its main component or a three-layer structure of a titanium nitride film, a film containing aluminum as its main component, and a titanium nitride film. The stacked structure achieves to have low wiring resistance, favorable ohmic contact, and a function as an anode.

The EL layer 616 is fondled by various methods such as an evaporation method using an evaporation mask, an inkjet method, a spin coating method, or the like. The EL layer 616 includes the organic semiconductor material described in Embodiment 1. Low molecular compounds, high molecular compounds, oligomers, or dendrimers may be used as a material for the EL layer 616. As the material for the EL layer, not only an organic compound but also an inorganic compound may be used.

As the material for the second electrode 617, various types of metals, alloys, electrically conductive compounds, mixtures of these, or the like can be used. If the second electrode is used as a cathode, it is preferable to use a metal, an alloy, an electrically conductive compound, a mixture thereof, or the like with a low work function (preferably, a work function of 3.8 eV or lower) among such materials. As an example, an element belonging to Group 1 or Group 2 in the periodic table, i.e., an alkali metal such as lithium (Li) or cesium (Cs), an alkaline earth metal such as magnesium (Mg), calcium (Ca), or strontium (Sr), or an alloy containing any of these (such as MgAg or AlLi); and the like are given. In the case where light generated in the EL layer 616 is transmitted through the second electrode 617, the second electrode 617 can be formed using a stack of a metal thin film and a transparent conductive film (indium tin oxide (ITO), indium tin oxide containing silicon or silicon oxide, indium zinc oxide (IZO), indium oxide containing tungsten oxide and zinc oxide (IWZO), or the like).

Further, the sealing substrate 604 is attached to the element substrate 610 with the sealing material 605, so that a light-emitting element 618 is provided in the space 607 surrounded by the element substrate 610, the sealing substrate 604, and the sealing material 605. Note that the space 607 is filled with a filler in some cases. There are cases where the space 607 may be filled with an inert gas (such as nitrogen or argon), or where the space 607 may be filled with a material similar to the sealant 605.

An epoxy based resin is preferably used for the sealing material 605. A material used for these is desirably a material which does not transmit moisture or oxygen as possible. As a material for the sealing substrate 604, a plastic substrate made of Fiberglass-Reinforced Plastics (FRP), polyvinyl fluoride (PVF), polyester, acrylic, or the like can be used besides a glass substrate or a quartz substrate.

As described above, the light-emitting device having the light-emitting element of the present invention can be obtained.

The light-emitting device of the present invention includes the light-emitting element described in any of Embodiments 1 to 3. The light-emitting element described in any of Embodiments 1 to 3 has high luminous efficiency and a low driving voltage. Therefore, a light-emitting device which can emit light with high luminance can be obtained. Further, a light-emitting device with low power consumption can be obtained.

Figure 6A:
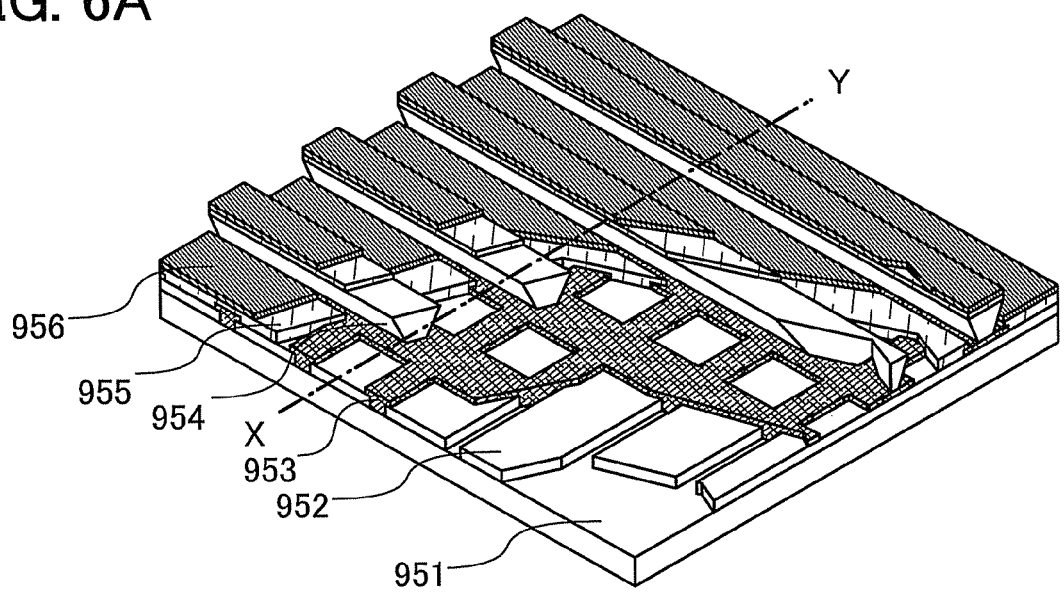
FIGS. 6A and 6B show a light-emitting device of the present invention.
Figure 6B:
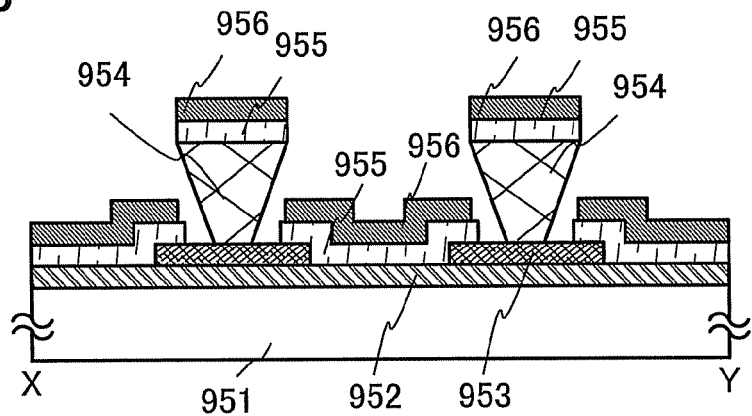

As described above, an active-matrix light-emitting device that controls driving of a light-emitting element with a transistor is described in this embodiment; however, a passive-matrix light-emitting device may be used. FIGS. 6A and 6B show a passive matrix light-emitting device manufactured by application of the present invention. FIG. 6A is a perspective view of the light-emitting device, and FIG. 6B is a cross-sectional view taken along a line X-Y of FIG. 6A. In FIGS. 6A and 6B, over a substrate 951, an EL layer 955 is provided between an electrode 952 and an electrode 956. An edge portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. That is, a cross section taken along the direction of the short side of the partition wall layer 954 is trapezoidal, and the lower side (a side which is in the same direction as a plane direction of the insulating layer 953 and in contact with the insulating layer 953) is shorter than the upper side (a side which is in the same direction as the plane direction of the insulating layer 953 and not in contact with the insulating layer 953). A cathode can be patterned by providing the partition layer 954 in this manner. In addition, in a passive matrix light-emitting device, a light-emitting device with low power consumption can be obtained by including a light-emitting element with high emission efficiency and low driving voltage according to the present invention.

Note that this embodiment can be freely combined with the other embodiments.

(Embodiment 6)

In this embodiment, electronic devices of the present invention each including the light-emitting device described in Embodiment 4 in a part will be described. The electronic devices of the present invention each have the light-emitting element described in any of Embodiments 1 to 3, and thus have a display portion with low power consumption.

As the electronic device manufactured by using the light-emitting device of the present invention, video cameras or digital cameras, goggle-type displays, navigation systems, audio reproducing devices (such as car audio components or an audio components), computers, game machines, portable information terminals (mobile computers, cellular phones, mobile game machines, or electronic books), image reproducing devices equipped with a recording medium (specifically, devices equipped with a display device for reproducing a recording medium such as digital versatile disk (DVD) and displaying the image), and the like are given. Specific examples of these electronic devices are shown in FIGS. 6A and 6B, FIGS. 7A to 7D, FIGS. 8A to 8C, FIG. 9, FIG. 10, FIG. 11, FIG. 12, and FIG. 13.

Figure 7A:
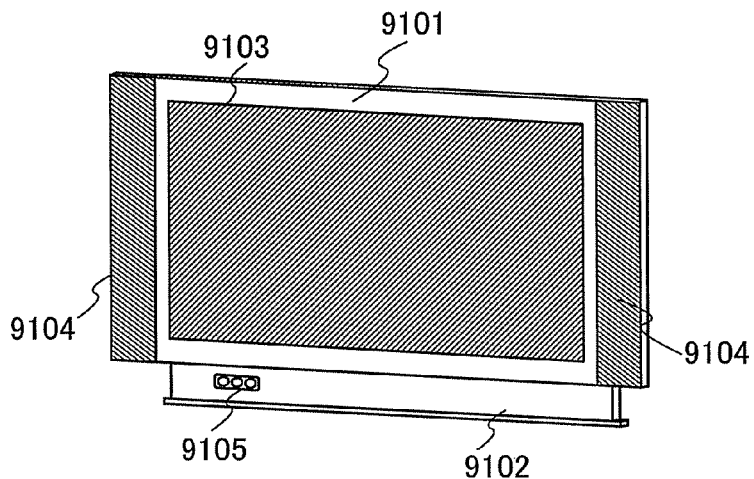
FIGS. 7A to 7D each show an electronic device of the present invention.

FIG. 7A shows a television device of this embodiment, which includes a housing 9101, a support base 9102, a display portion 9103, a speaker portion 9104, a video input terminal

9105, and the like. In the display portion 9103 of this television device, light-emitting elements similar to those described in any of Embodiments 1 to 3 are arranged in matrix. The light-emitting elements have a characteristic of high luminous efficiency and low power consumption. In addition, the light-emitting elements also have a characteristic of low driving voltage. The display portion 9103 including the light-emitting elements has similar characteristics; therefore, the television device has low power consumption. Such characteristics can dramatically reduce or downsize power supply circuits in the television device, whereby the housing 9101 and the support base 9102 can be reduced in size and weight. In the television device of this embodiment, reduction in power consumption and reduction in size and weight are achieved; thus, a product suitable for living environment can be provided.

Figure 7B:
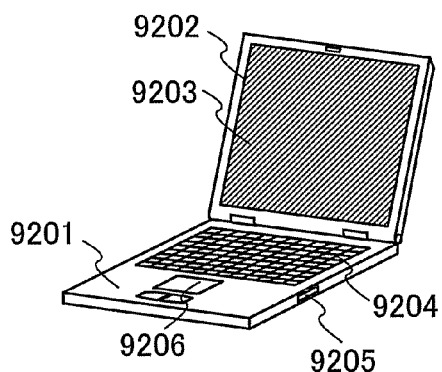

FIG. 7B shows a computer of this embodiment, which includes a main body 9201, a housing 9202, a display portion 9203, a keyboard 9204, an external connection port 9205, a pointing device 9206, and the like. In the display portion 9203 of this computer, light-emitting elements similar to those described in any of Embodiments 1 to 3 are arranged in matrix. The light-emitting elements have a characteristic of high luminous efficiency and low power consumption. In addition, the light-emitting elements also have a characteristic of low driving voltage. The display portion 9203 including the light-emitting elements has similar characteristics; therefore, the computer consumes low power. Such characteristics can dramatically reduce or downsize power supply circuits in the computer, whereby the main body 9201 and the housing 9202 can be reduced in size and weight. In the computer of this embodiment, reduction in power consumption and reduction in size and weight are achieved; thus, a product suitable for environment can be provided.

Figure 7C:
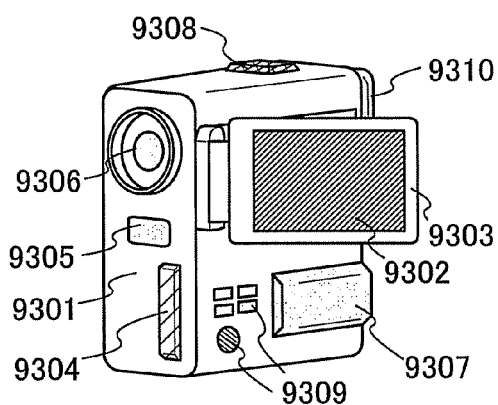

FIG. 7C shows a camera of this embodiment, which includes a main body 9301, a display portion 9302, a housing 9303, an external connection port 9304, a remote control receiving portion 9305, an image receiving portion 9306, a battery 9307, audio input portion 9308, operation keys 9309, an eyepiece portion 9310, and the like. In the display portion 9302 of this camera, light-emitting elements similar to those described in any of Embodiments 1 to 3 are arranged in matrix. The light-emitting elements have a characteristic of high luminous efficiency and low power consumption. In addition, the light-emitting elements also have a characteristic of low driving voltage. The display portion 9302 including such light-emitting elements has similar characteristics; therefore, this camera consumes low power. Such characteristics can dramatically reduce or downsize power supply circuits in the camera, whereby the main body 9301 can be reduced in size and weight. In the camera of this embodiment, reduction in power consumption and reduction in size and weight are achieved; thus, a product suitable for being carried around can be provided.

Figure 7D:
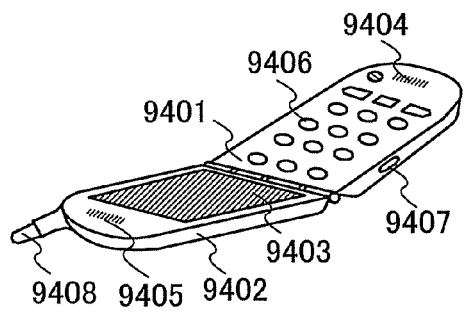

FIG. 7D shows a mobile phone of this embodiment, which includes a main body 9401, a housing 9402, a display portion 9403, an audio input portion 9404, an audio output portion 9405, operation keys 9406, an external connection port 9407, an antenna 9408, and the like. In the display portion 9403 of this mobile phone, light-emitting elements similar to those described in any of Embodiments 1 to 3 are arranged in matrix. The light-emitting elements have a characteristic of high luminous efficiency and low power consumption. In addition, the light-emitting elements also have a characteristic of low driving voltage. The display portion 9403 including the light-emitting elements has similar characteristics; therefore, the mobile phone consumes low power. Such characteristics can dramatically reduce or downsize power supply circuits in the cellular phone, whereby the main body 9401 and the housing 9402 can be reduced in size and weight. In the mobile phone of this embodiment, reduction in power consumption and reduction in size and weight are achieved; thus, a product suitable for being carried around can be provided.

Figure 8A:
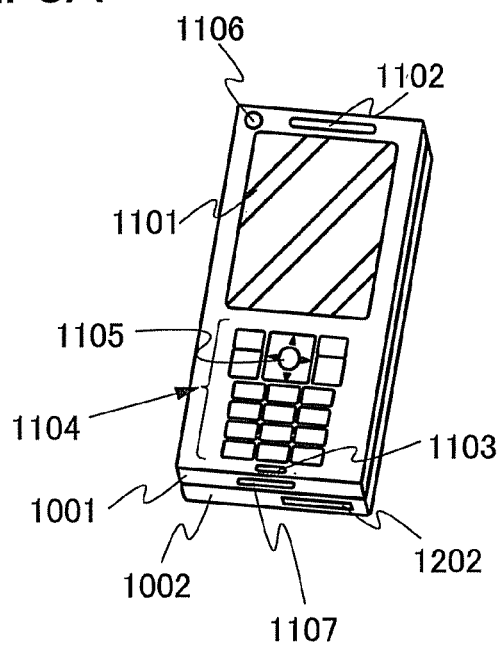
FIGS. 8A to 8C each show an electronic device of the present invention.
Figure 8B:
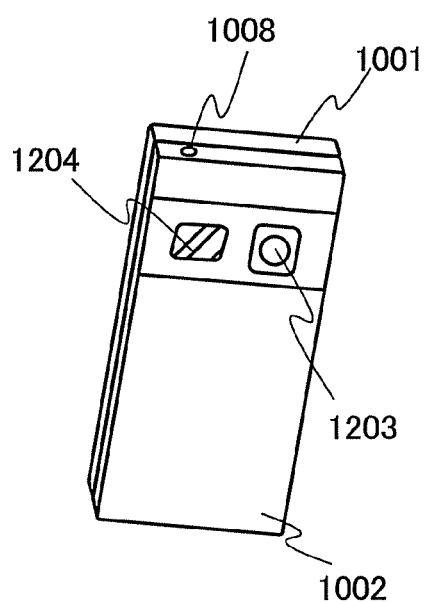
Figure 8C:
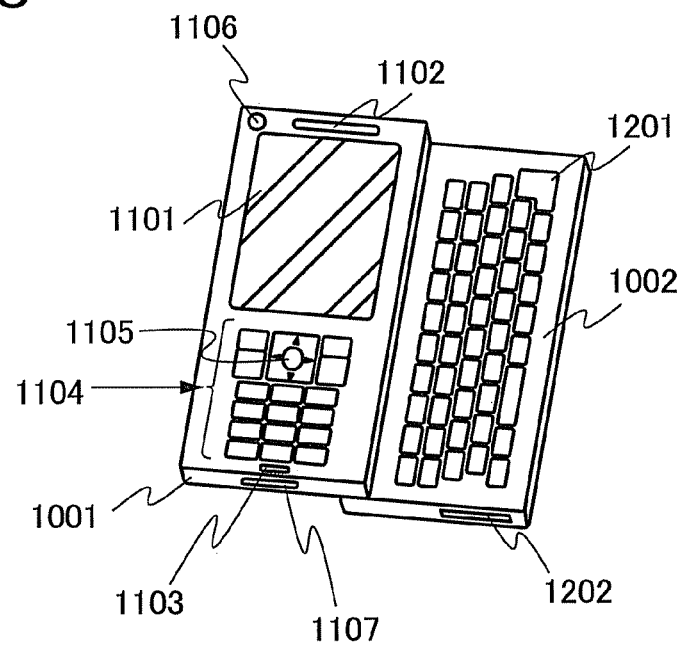

FIGS. 8A to 8C show an example of a mobile phone having a different structure shown in FIG. 7D. FIG. 8A is a front view, FIG. 8B is a rear view, and FIG. 8C is a development view. The mobile phone shown in FIGS. 8A to 8C is a so-called smartphone having a function of a phone and a function of a portable information terminal, incorporating a computer, and conducting a variety of data processing in addition to voice calls.

The mobile phone shown in FIGS. 8A to 8C has two housings: a housing 1001 and a housing 1002. The housing 1001 includes a display portion 1101, a speaker 1102, a microphone 1103, operation keys 1104, a pointing device 1105, a camera lens 1106, an external connection terminal 1107, an earphone terminal 1108, and the like, while the housing 1002 includes a keyboard 1201, an external memory slot 1202, a camera lens 1203, a light 1204, and the like. In addition, an antenna is incorporated in the housing 1001.

In addition to the above-described structure, the mobile phone may incorporate a wireless IC chip, a small size memory device, or the like.

The light-emitting device described in Embodiment 4 can be incorporated in the display portion 1101, and a display orientation can be appropriately changed depending on a usage pattern. Because the camera lens 1106 is provided in the same plane as the display portion 1101, the mobile phone can be used as a videophone. Further, a still image and a moving image can be taken with the camera lens 1203 and the light 1204 by using the display portion 1101 as a viewfinder. The speaker 1102 and the microphone 1103 can be used for video calls, recording, reproducing, and the like without being limited to voice calls. With the use of the operation keys 1104, making and receiving calls, inputting simple information such as e-mail or the like, scrolling the screen, moving the cursor, and the like are possible. Further, the housing 1001 and the housing 1002 in FIG. 8A, which are overlapped with each other, are slid as shown in FIG. 8C, and can be used as a portable information terminal. In that case, smooth operation can be conducted using the keyboard 1201 and the pointing device 1105. The external connection terminal 1107 can be connected to an AC adaptor and various types of cables such as a USB cable, and charging and data communication with a computer or the like are possible. Furthermore, a large amount of data can be stored and moved by inserting a recording medium into the external memory slot 1202.

The mobile phone may be equipped with an infrared communication function, a television receiving function, and the like, in addition to the above-described functions.

Figure 9:
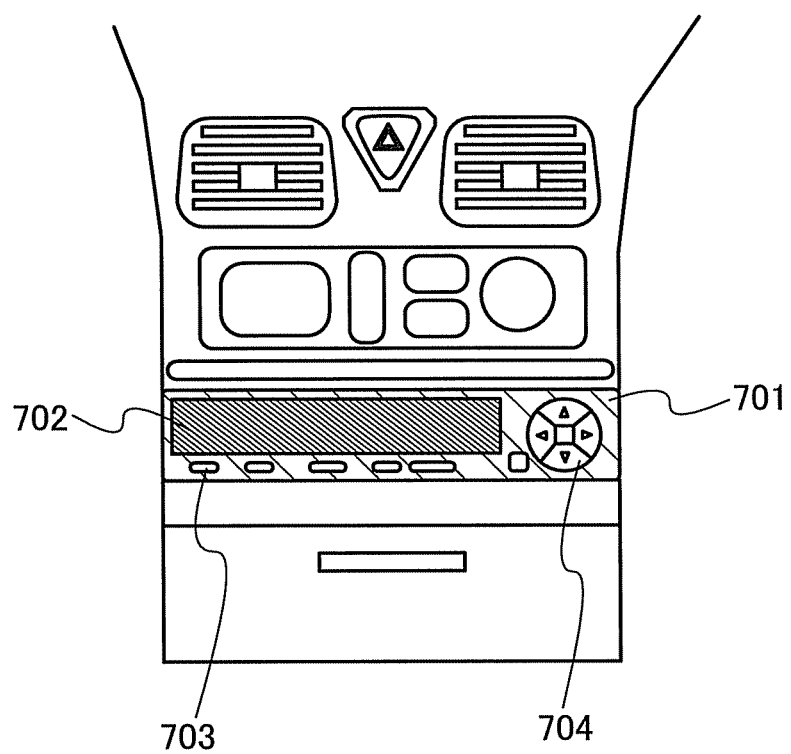
FIG. 9 shows an electronic device of the present invention.

FIG. 9 is an audio reproducing device, specifically, a car audio stereo, which includes a main body 701, a display portion 702, and operation switches 703 and 704. The display portion 702 can be realized using the light-emitting device (passive-matrix type or active-matrix type) described in Embodiment 4. Further, this display portion 702 may be formed using a segment type light-emitting device. In any case, the use of a light-emitting element of the present invention makes it possible to form a bright display portion while achieving low power consumption, with the use of a vehicle power source (12 V to 42 V). Although an in-car audio system is described in this embodiment, the present invention may be used for a portable audio device or an audio device for household use.

Figure 10:
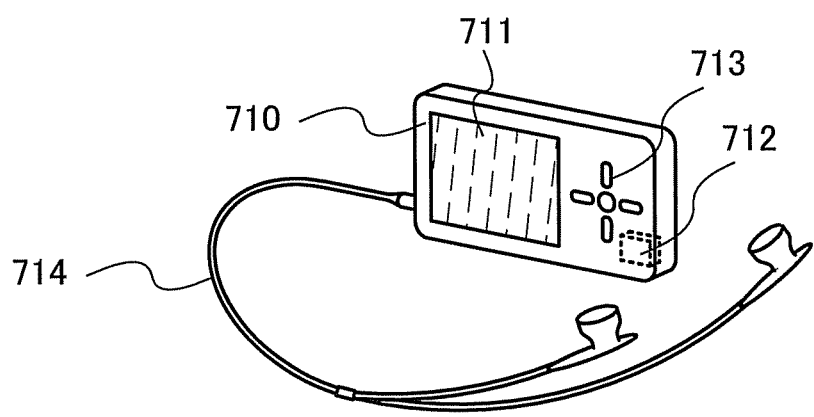
FIG. 10 shows an electronic device of the present invention.

FIG. 10 shows a digital player as an example of an audio reproducing device. The digital player shown in FIG. 10 includes a main body 710, a display portion 711, a memory portion 712, an operation portion 713, a pair of earphones 714, and the like. Note that a pair of headphones or a pair of wireless earphones can be used instead of the pair of earphones 714. The display portion 711 can be realized using the (passive matrix or active matrix) light-emitting device described in Embodiment 4. Further, the display portion 711 may be formed using a segment type light-emitting device. In any case, the use of the light-emitting element of the present invention makes it possible to form a bright display portion which can display images even when using a secondary battery (a nickel-hydrogen battery or the like) while achieving low power consumption. As the memory portion 712, a hard disk or a nonvolatile memory is used. For example, a NAND type nonvolatile memory with a recording capacity of 20 gigabytes (GB) to 200 gigabytes (GB) is used and the operation portion 713 is operated, whereby an image or a sound (for example, music) can be recorded and reproduced. Note that power consumption can be reduced by displaying white characters against a black background in the display portions 702 and 711. This is particularly effective in a portable audio device.

As described above, an application range of the light-emitting device manufactured by employing the present invention is quite wide, and this light-emitting device can be applied to electronic devices of various fields. By employing the present invention, an electronic device having a display portion with low power consumption can be manufactured.

Further, a light-emitting device employing the present invention includes the light-emitting element described in any of Embodiments 1 to 3 having high luminous efficiency and can be used as a lighting device. The light-emitting device employing the present invention can emit light with high luminance and is preferably used as a lighting device. One embodiment of using the light-emitting element employing the present invention as a lighting device is described with reference to FIG. 11.

Figure 11:
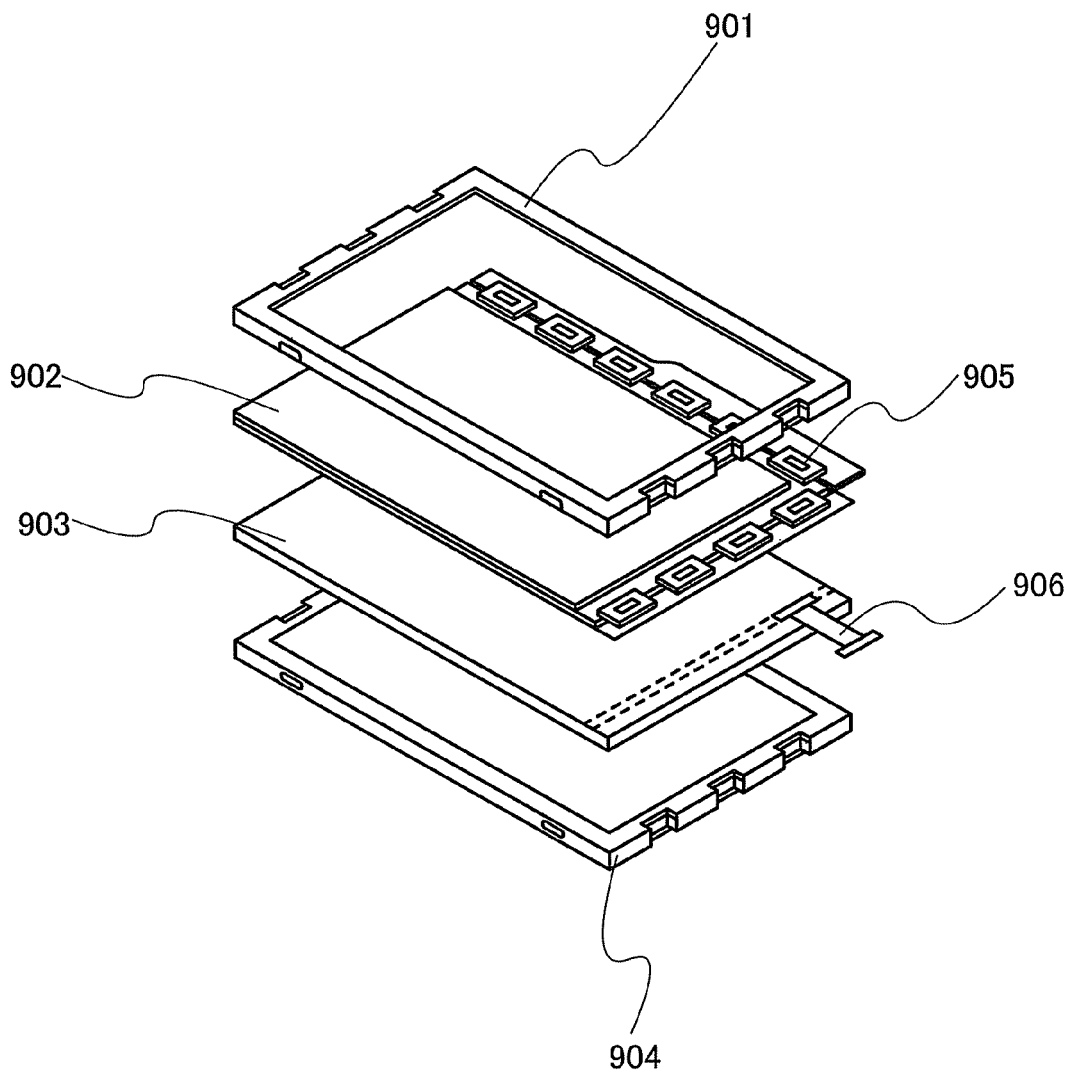
FIG. 11 shows a lighting device of the present invention.

FIG. 11 shows a liquid crystal display device using the light-emitting device of the present invention as backlight, as an example of an electronic device that is a lighting device using the light-emitting element of the present invention. The liquid crystal display device shown in FIG. 11 includes a housing 901, a liquid crystal layer 902, a backlight 903, and a housing 904, and the liquid crystal layer 902 is connected to a driver IC 905. The light-emitting device to which the present invention is applied is used as the backlight 903, and a current is supplied through a terminal 906.

Because the light-emitting device of the present invention is thin and consumes low power, reduction in thickness and low power consumption of a liquid crystal display device is possible by using a light-emitting device of the present invention as a backlight of the liquid crystal display device. Moreover, a light-emitting device according to the present invention is a plane-emission lighting device and can be increased in size. Thus, it becomes possible to increase the size of the backlight and also a liquid crystal display device.

Figure 12:
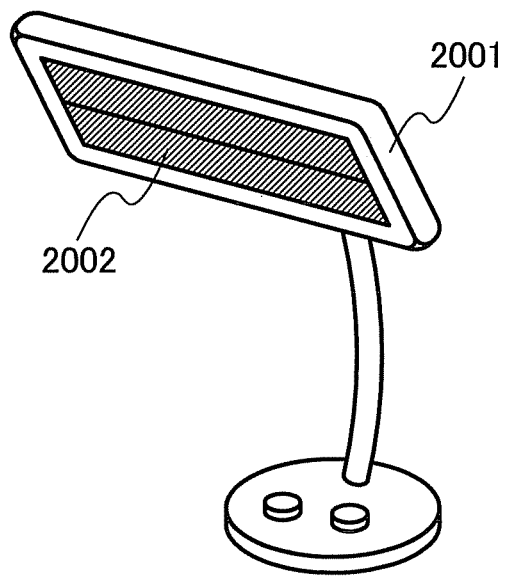
FIG. 12 shows a lighting device of the present invention.

FIG. 12 shows an example of using a light-emitting device according to the present invention as a desk lamp which is a lighting device. The desk lamp shown in FIG. 12 includes a housing 2001 and a light source 2002, and a light-emitting device according to the present invention is used as the light source 2002. Because a light-emitting device of the present invention consumes low power, the desk lamp also consumes low power.

Figure 13:
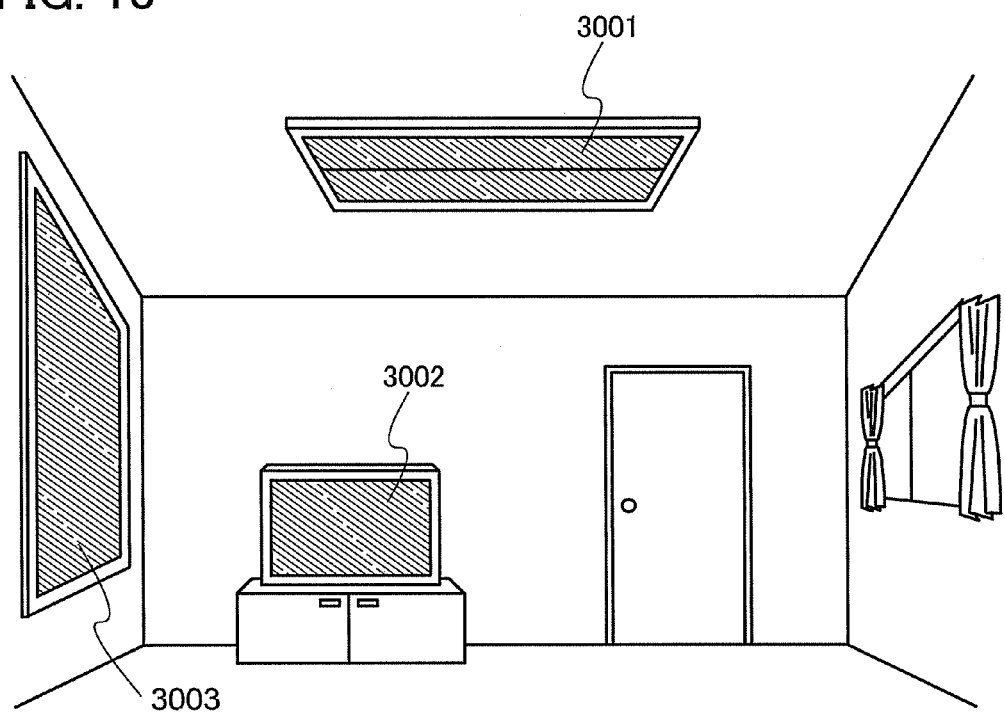
FIG. 13 shows lighting devices of the present invention.

FIG. 13 shows an example in which a light-emitting device to which a light-emitting element of the present invention is applied is used as interior lighting devices 3001 and 3003. Because a light-emitting device according to the present invention can be increased in size, it can be used as a large-area lighting device. In addition, since the light-emitting element according to the present invention has high luminous efficiency and a light-emitting device using the light-emitting element has low power consumption, it can be used for a lighting device having low power consumption. A television device 3002 of the present invention as described with FIG. 7A can be placed in a room in which the light-emitting device of the present invention is used as the interior lighting device 3001, where public broadcasting and movies can be enjoyed. In such a case, since both devices consume low power, environmental load can be reduced.

Note that this embodiment can be freely combined with the other embodiments.

This application is based on Japanese Patent Application Ser. No. 2010-261192 filed with Japan Patent Office on Nov. 24, 2010, the entire contents of which are hereby incorporated by reference.

What is claimed is:

1. A light-emitting element comprising: a layer including an organic compound between a pair of electrodes, wherein the layer comprises at least: a first monomolecular layer comprising a luminescent center material having a fluorescent light-emitting property; and a second monomolecular layer comprising a host material having a carrier-transport property and a band gap larger than a band gap of the luminescent center material, and wherein a surface of the second monomolecular layer is in contact with a surface of the first monomolecular layer, wherein a transition dipole moment of the luminescent center material is parallel to a top surface of a substrate, and wherein a transition dipole moment of the host material is parallel to the top surface of the substrate.

2. The light-emitting element according to claim 1,
wherein a first skeleton of the host material is adjacent to a second skeleton of the luminescent center material,
wherein the first skeleton contributes to acceptance of an excitation energy, and
wherein the second skeleton contributes to donation of an excitation energy.

3. The light-emitting element according to claim 1,
wherein a first skeleton of the host material is adjacent to a second skeleton of the luminescent center material,
wherein the first skeleton contributes to acceptance of a carrier, and
wherein the second skeleton contributes to donation of a carrier.

4. The light-emitting element according to claim 1, further comprising:
a second layer consisting of a composite material in which an acceptor substance is included in a substance having a high hole-transport property, between the pair of electrodes, and
wherein the second monomolecular layer and the second layer share an interface which is different from an interface shared by the first monomolecular layer and the second monomolecular layer.

5. The light-emitting element according to claim 4, wherein a plurality of stacks is stacked, each of stacks comprising:
the second layer;
the first monomolecular layer; and
the second monomolecular layer.

6. The light-emitting element according to claim 5, wherein a total thickness of the plurality of stacks is greater than or equal to 30 nm and less than or equal to 200 nm.

7. A light-emitting device comprising:
the light-emitting element according to claim 1; and
a control circuit capable of controlling the light-emitting element.

8. A lighting device comprising:
the light-emitting element according to claim 1; and
a control circuit capable of controlling the light-emitting element.

9. An electronic device comprising the light-emitting device according to claim 7.

10. An electronic device comprising the lighting device according to claim 8.

11. A light-emitting element comprising: a layer including an organic compound between a pair of electrodes, wherein the layer comprises at least: a first monomolecular layer comprising a luminescent center material having a phosphorescent light-emitting property; and a second monomolecular layer comprising a host material having a carrier-transport property and a triplet excited energy larger than a triplet excited energy of the luminescent center material, and wherein a surface of the second monomolecular layer is in contact with a surface of the first monomolecular layer, wherein a transition dipole moment of the luminescent center material is parallel to a top surface of a substrate, and wherein a transition dipole moment of the host material is parallel to the top surface of the substrate.

12. The light-emitting element according to claim 11,
wherein a first skeleton of the host material is adjacent to a second skeleton of the luminescent center material,
wherein the first skeleton contributes to acceptance of an excitation energy, and
wherein the second skeleton contributes to donation of an excitation energy.

13. The light-emitting element according to claim 11,
wherein a first skeleton of the host material is adjacent to a second skeleton of the luminescent center material,
wherein the first skeleton contributes to acceptance of a carrier, and
wherein the second skeleton contributes to donation of a carrier.

14. The light-emitting element according to claim 11, further comprising:
a second layer consisting of a composite material in which an acceptor substance is included in a substance having a high hole-transport property, between the pair of electrodes, and
wherein the second monomolecular layer and the second layer share an interface which is different from an interface shared by the first monomolecular layer and the second monomolecular layer.

15. The light-emitting element according to claim 14, wherein a plurality of stacks is stacked, each of stacks comprising:
the second layer;
the first monomolecular layer; and
the second monomolecular layer.

16. The light-emitting element according to claim 15,
wherein a total thickness of the plurality of stacks is greater than or equal to 30 nm and less than or equal to 200 nm.

17. A light-emitting device comprising:
the light-emitting element according to claim 11; and
a control circuit capable of controlling the light-emitting element.

18. A lighting device comprising:
the light-emitting element according to claim 11; and
a control circuit capable of controlling the light-emitting element.

19. An electronic device comprising the light-emitting device according to claim 17.

20. An electronic device comprising the lighting device according to claim 18.

* * * * *

UNITED STATES PATENT AND TRADEMARK OFFICE
CERTIFICATE OF CORRECTION

PATENT NO. : 8,809,841 B2  
APPLICATION NO. : 13/303637  
DATED : August 19, 2014  
INVENTOR(S) : Shunpei Yamazaki et al.

Page 1 of 1

It is certified that error appears in the above-identified patent and that said Letters Patent is hereby corrected as shown below:

In the Specification:

Column 7, Line 9; Change "Ruined" to --formed--.

Column 9, Line 26; Change ")-N,N-bis" to --)-N,N'-bis--.

Column 11, Line 66; Change "1,6DPhAPm" to --1,6DPhAPrn--.

Column 15, Line 20; Change "5'bistrifluoroethylphenyl)" to --5'bistrifluoromethyl)--.

Column 15, Line 22; Change "ridium" to --iridium--.

Column 16, Line 21 to 22; Change "fiuoranthene-3," to --fluoranthene-3,--.

Column 16, Line 37; Change "benzothiazolyephenolato]" to --benzothiazolyl)phenolato]--.

Column 16, Line 51; Change "(Spiro-9," to --(spiro-9,--.

Column 17, Line 10 to 11; Change "(stil-bene-3,3$^1$-diyl)" to --(stil-bene-3,3'-diyl)--.

Column 18, Line 50; Change "foimation" to --formation--.

Column 18, Line 63; Change "foamed" to --formed--.

Column 20, Line 1; Change "fanned" to --formed--.

Column 20, Line 46; Change "fowled" to --formed--.

Column 21, Line 59; Change "foiined" to --formed--.

Column 23, Line 26; Change "fondled" to --formed--.

Column 25, Line 39; Change "9307, audio" to --9307, an audio--.

Signed and Sealed this  
Thirteenth Day of January, 2015

Michelle K. Lee  
*Deputy Director of the United States Patent and Trademark Office*